(12) United States Patent
Schirwitz et al.

(10) Patent No.: US 12,012,494 B2
(45) Date of Patent: Jun. 18, 2024

(54) MULTILAYER BODY, COMPRISING A SUBSTRATE LAYER CONTAINING POLYCARBONATE, TALC AND WAX

(71) Applicant: Covestro Deutschland AG, Leverkusen (DE)

(72) Inventors: Christopher Schirwitz, Leverkusen (DE); Michael Erkelenz, Duisburg (DE); Birte Sämisch, Cologne (DE); Rainer Protte, Dormagen (DE); Martin Döbler, Düsseldorf (DE); Eckhard Wenz, Cologne (DE)

(73) Assignee: Covestro Deutschland AG, Leverkusen (DE)

( * ) Notice: Subject to any disclaimer, the term of this patent is extended or adjusted under 35 U.S.C. 154(b) by 1035 days.

(21) Appl. No.: 16/956,532

(22) PCT Filed: Dec. 12, 2018

(86) PCT No.: PCT/EP2018/084605
§ 371 (c)(1),
(2) Date: Jun. 19, 2020

(87) PCT Pub. No.: WO2019/121256
PCT Pub. Date: Jun. 27, 2019

(65) Prior Publication Data
US 2022/0135755 A1  May 5, 2022

(30) Foreign Application Priority Data
Dec. 19, 2017 (EP) .................... 17208573

(51) Int. Cl.
*C08J 7/06* (2006.01)
*C08K 3/04* (2006.01)
*C08K 3/34* (2006.01)
*C08K 3/38* (2006.01)
*C08K 7/24* (2006.01)
*C23C 14/20* (2006.01)
*C23C 14/58* (2006.01)

(52) U.S. Cl.
CPC .................. *C08J 7/06* (2013.01);
*C08K 3/04* (2013.01); *C08K 3/34* (2013.01);
*C08K 3/38* (2013.01); *C08K 7/24* (2013.01);
*C23C 14/20* (2013.01); *C23C 14/58* (2013.01);
*C08J 2369/00* (2013.01); *C08J 2423/26* (2013.01); *C08K 2003/385* (2013.01); *C08K 2201/003* (2013.01)

(58) Field of Classification Search
CPC ...... C08J 7/06; C08J 2423/26; C08J 2369/00; C23C 14/20; C23C 14/58; C08K 3/34; C08K 7/24; C08K 3/38; C08K 2201/003; C08K 2003/385
See application file for complete search history.

(56) References Cited

U.S. PATENT DOCUMENTS

| | | |
|---|---|---|
| 1,137,373 A | 4/1915 | Aylsworth |
| 1,191,383 A | 7/1916 | Aylsworth |
| 2,991,273 A | 7/1961 | Wilhelm et al. |
| 2,999,825 A | 9/1961 | Floyd et al. |
| 2,999,846 A | 9/1961 | Hermann et al. |
| 3,028,635 A | 4/1962 | Herubel |
| 3,148,172 A | 9/1964 | Fox |
| 3,271,367 A | 9/1966 | Hermann et al. |
| 3,404,061 A | 10/1968 | Shane et al. |
| 3,564,077 A | 2/1971 | Brinkmann et al. |
| 3,919,353 A | 11/1975 | Castelnuovo et al. |
| 4,584,360 A | 4/1986 | Paul et al. |
| 4,982,014 A | 1/1991 | Freitag et al. |
| 5,097,002 A | 3/1992 | Sakashita et al. |
| 5,340,905 A | 8/1994 | Kuehling et al. |
| 5,717,057 A | 2/1998 | Sakashita et al. |
| 5,898,009 A | 4/1999 | Shaffer et al. |
| 6,048,511 A | 4/2000 | Shaffer et al. |
| 6,652,822 B2 | 11/2003 | Phillips et al. |
| 6,951,583 B2 | 10/2005 | Clere et al. |
| 2001/0021740 A1 | 9/2001 | Lodyga et al. |
| 2004/0208812 A1 | 10/2004 | Clere |
| 2005/0041373 A1 | 2/2005 | Pruss et al. |
| 2013/0267665 A1 | 10/2013 | Huggins et al. |
| 2014/0243467 A1* | 8/2014 | Dern ............... C08K 7/14 524/508 |
| 2014/0329071 A1 | 11/2014 | Meyer et al. |

(Continued)

FOREIGN PATENT DOCUMENTS

| | | |
|---|---|---|
| DE | 1570703 A1 | 2/1970 |
| DE | 1694173 A1 | 6/1971 |
| DE | 2036052 A1 | 1/1972 |

(Continued)

OTHER PUBLICATIONS

Machine Translation of TW-201303499-A, retrieved Jul. 18, 2023.*

(Continued)

*Primary Examiner* — Robert D Harlan
(74) *Attorney, Agent, or Firm* — The Webb Law Firm

(57) ABSTRACT

The invention relates to a multilayer body comprising at least one substrate layer, a metal layer bonded directly thereto and optionally at least one protective layer atop the metal layer, wherein the substrate layer comprises a composition which is obtained by mixing polycarbonate, talc and a specific wax. It was shown that the multilayer bodies obtained are particularly suitable for use as reflectors and (housing) components for light sources and heat sources and displays.

15 Claims, No Drawings

(56) References Cited

U.S. PATENT DOCUMENTS

2017/0342262 A1  11/2017  Choi et al.

FOREIGN PATENT DOCUMENTS

| | | |
|---|---|---|
| DE | 2063050 A1 | 7/1972 |
| DE | 2211956 A1 | 10/1973 |
| DE | 2348377 A1 | 4/1975 |
| DE | 3334782 A1 | 10/1984 |
| DE | 3832396 A1 | 2/1990 |
| EP | 0500496 A1 | 8/1992 |
| EP | 0839623 A1 | 5/1998 |
| FR | 1561518 A | 3/1969 |
| GB | 1122003 A | 7/1968 |
| GB | 1341318 A | 12/1973 |
| JP | 61-062039 A | 3/1986 |
| JP | 61-062040 A | 3/1986 |
| JP | 61-105550 A | 5/1986 |
| JP | 4239697 A | 8/1992 |
| JP | 08-188708 A | 7/1996 |
| JP | 200025369 A | 1/2000 |
| JP | 201649629 A | 4/2016 |
| TW | 201303499 A * | 1/2013 ............ C08F 220/36 |
| WO | 96/15102 A2 | 5/1996 |
| WO | 99/55772 A1 | 11/1999 |
| WO | 01/05866 A1 | 1/2001 |
| WO | 2004/063249 A1 | 7/2004 |
| WO | 2008/042446 A2 | 4/2008 |
| WO | 2013/045552 A1 | 4/2013 |
| WO | WO-2013045552 A1 * | 4/2013 ............... C08K 7/14 |
| WO | 2013/079398 A1 | 6/2013 |
| WO | WO-2013079398 A1 * | 6/2013 ......... B29C 45/0053 |
| WO | 2013/124232 A1 | 8/2013 |
| WO | 2015/052110 A1 | 4/2015 |

OTHER PUBLICATIONS

International Preliminary Report on Patentability received for PCT Patent Application No. PCT/EP2018/084605, mailed on Jul. 2, 2020, 13 pages (8 pages of English Translation and 5 pages of Original Document).

International Search Report and Written Opinion received for PCT Patent Application No. PCT/EP2018/084605, mailed on Feb. 28, 2019, 15 pages (7 pages of English Translation and 8 pages of Original Document).

* cited by examiner

MULTILAYER BODY, COMPRISING A SUBSTRATE LAYER CONTAINING POLYCARBONATE, TALC AND WAX

CROSS-REFERENCE TO RELATED APPLICATIONS

This application is a national stage application (under 35 U.S.C. § 371) of PCT/EP2018/084605, filed Dec. 12, 2018, which claims benefit of European Application No. 17208573.0, filed Dec. 19, 2017, both of which are incorporated herein by reference in their entirety.

The present invention relates to a multilayer body comprising at least one substrate layer, a metal layer bonded directly thereto, and optionally a protective layer atop the metal layer. The substrate layer comprises a composition containing polycarbonate, talc and a specific wax. The present invention further relates to moulded articles such as reflectors and (housing) components of light sources and heat sources, wherein additional functionality can be integrated into the component, and to a process for producing a multilayer body and to the use of a specific wax in the substrate layer of a multilayer body.

Owing to their high thermal stability and heat distortion resistance, some uses of polycarbonates are in sectors in which elevated thermal stress is to be expected. Specific copolycarbonates (for example copolycarbonate based on bisphenol A and bisphenol TMC (1,1-bis(4-hydroxyphenyl)-3,3,5-trimethylcyclohexane)) also find use in these sectors since they often have even better heat distortion resistance. Polycarbonates are therefore also suitable for production of lenses, reflectors, lamp covers and housings etc. that are subjected to relatively high thermal stress. In these applications, it is virtually always the case that elevated thermal properties such as thermal stability or heat distortion resistance in combination with improved thermal conductivity and good or even improved dimensional stability (CLTE, see below) with adequate mechanical properties such as impact resistance are absolutely necessary.

As well as good processibility and good mechanical properties, the thermoplastic compositions must also meet further demands such as good surface quality in the resulting injection moulding/extrudate, and also good metallizability and good metal adhesion.

In the field of reflector applications, as well as metal adhesion, an additional feature of primary importance is in fact low thermal expansion of the substrate material and hence of the reflector as well. High thermal expansion can have an adverse effect on concentration of light and on light yield. The reflector is usually disposed in the direct environment of the light source, for example an incandescent lamp or an LED, which frequently radiates a large amount of heat. Thus, the reflector is exposed to high thermal stress—frequently above 120° C. For this reason, it is necessary to use a substrate material having a minimum coefficient of linear thermal expansion (CLTE) and hence good dimensional stability. Preferably, the metal layer of the multilayer body has similar expansion characteristics and shrinkage characteristics to the substrate layer, since there can otherwise be surface distortions and hence iridescence phenomena as a result of stresses. Surface defects such as cracking, iridescence and compression can thus be reduced.

Clear non-profiled polycarbonate panels are nowadays in frequent use for coverage of reflectors in the automotive sector. This increases the demands on the surface quality of elements that are clearly visible from the outside (e.g. reflectors, sub-reflectors, masking frames), with continued importance of dimensional stability when hot, low outgassing to avoid blistering, mechanical strength, simple processing and low manufacturing tolerances. It should preferably be possible to combine the material for the substrate layer with clear polycarbonate panels of this kind by injection moulding.

As described above, correspondingly metallized parts must have high thermal stability/heat distortion resistance. Thus, there must be no decrease either in the mechanical properties or in the optical properties, for example the quality of the metal surface.

In order to minimize the cost of the materials that form the substrate layer of the multilayer body, fillers are used in some cases, by replacing the thermoplastic partly with less expensive fillers. According to the desired properties, for example elevated flame retardancy or low shrinkage characteristics, additives are added. However, the addition of fillers frequently leads to a rough, matt or irregular surface, which means that the high demands on surface quality of the (usually curved) substrate layer that is subsequently metallized are not fulfilled. Specifically in the case of reflectors, where the light yield is essential, a very smooth, high-gloss surface of maximum homogeneity has to be provided for the coating.

Talc is a particularly favourable filler. In addition to the general problems in the addition of fillers that have already been addressed above, it is known that the addition of talc to molten polycarbonates leads to degradation of the polymer chains, which is ultimately manifested in poorer mechanical properties of the resulting moulded polycarbonate articles.

The reinforcement of polycarbonates by the filler talc is desirable for many applications owing to the thermal conductivity and favourable market availability of talc.

In order nevertheless to achieve moulded articles comprising polycarbonates and talc with adequate mechanical properties, stabilized compositions are used for the production of the moulded articles. A starting point here is the prior sizing of the talc, which chemically masks the basic groups of the talc responsible for the ester hydrolysis in the polycarbonate, and hence degradation of the polymer chains can essentially be prevented. However, such sizing of the talc constitutes an additional process step to which the talc filler has to be subjected beforehand. Such an additional process step is always associated with increased costs and time demands and is therefore disadvantageous. For example, WO 2013/124232 A1 describes talc as a filler in a multilayer body, although sizing is preferred.

JP 08-188708 A discloses compositions containing 45% to 97% by weight of an aromatic polycarbonate with 3% to 55% by weight of an inorganic filler (glass flakes, metal flakes, mica or talc) and 0.02% to 3% by weight, preferably 0.03% to 1% by weight, of an olefinic wax (corresponding to 0.006 to 3.33 parts wax to 10 parts filler) containing carboxylic groups or derivatives thereof. This document too points out that, when talc is used as filler, a silane-coated material should be used in order to avoid basic degradation of the polycarbonate. Example 11 describes a composition comprising 0.05 part wax to 10 parts talc. However, JP 08-188708 A does not give any hint at all as to how the additional step of prior sizing of the filler can be avoided. This document does not address the resulting surface quality of the moulding and the metal adhesion, and so no effect of the use of a combination of talc and a specific wax on these properties at all can be inferred therefrom.

WO 2013/045552 A1 describes a polycarbonate composition containing 2 to 40 parts by weight of an inorganic filler which may be talc among other substances, and 0.01 to 0.5 part by weight of an anhydride-modified alpha-olefin terpolymer. Some examples of WO 2013/045552 A1 describe the use of 0.5 or 1.0 part of a wax to 10 parts glass fibres or quartz flour. Talc is not used in the examples. This document does not address the specific problem of the degradation of polycarbonate resulting from the use of talc. Nor is the person skilled in the art able to infer any teaching from this document in relation to improvement in surface quality (and/or surface roughness), metal adhesion or CLTE.

Proceeding from this prior art, the problem addressed by the present invention was that of providing a multilayer body which has good thermal stability and heat distortion resistance, improved dimensional stability, preferably a low coefficient of linear thermal expansion (CLTE) of <50 ppm/K based on parallel thermal expansion and <60 ppm/K based on transverse thermal expansion according to DIN 53752 (1980-12), and improved surface quality in combination with good mechanical properties. In addition, the shaped multilayer bodies have improved thermal conductivity.

At the same time, the substrate layer of the multilayer body is to be producible in a very favourable manner More particularly, the problem addressed by the present invention was that of providing a substrate layer for a multilayer body which simultaneously has good dimensional stability on heating (CLTE), improved surface quality and metal adhesion, and hence has an excellent balance of these properties. The substrate layer is thus especially suitable for the production of multilayer bodies additionally comprising at least one metal layer that is subjected to elevated thermal stresses. The composition for the substrate layer is additionally to have a good profile of properties in relation to good flowability (shear viscosity profile) and good mechanical properties (modulus of elasticity and Charpy).

These objects were achieved by the provision of the multilayer body according to the invention, the process according to the invention, the moulded articles according to the invention, such as reflectors and (housing) components of light sources and heat sources, and the use according to the invention, all of which are elucidated in detail hereinafter.

It has been found that, surprisingly, multilayer bodies containing a substrate layer containing a combination of talc as filler with a specific wax and polycarbonate as thermoplastic (referred to hereinafter as substrate material) have the desired profile of properties of low thermal expansion and good mechanical properties. At the same time, they have improved surface quality, especially after variothermal heating, and good, preferably improved, metal adhesion. Overall, the compositions used have good processability, and the multilayer bodies according to the invention have good mechanical properties. It has additionally been found that, surprisingly, the multilayer bodies additionally have distinctly improved thermal conductivity which, for use in moulded articles such as reflectors and (housing) components of light sources, results in an additional improvement in distribution and dissipation of the heat load.

It has also been found that it is even possible to use unsized talc in the substrate material of the multilayer bodies according to the invention. The mixing of a specific wax having a specific acid number and a specific molecular weight with an unsized talc, especially a talc having an alkaline pH, preferably of 8 to 10, from the juncture of addition of the talc as filler to the polycarbonate melt, can achieve sizing sufficient to reduce the degradation of the ester groups of the polycarbonate. This means that an unsized talc B), which is also understood to mean a talc mixture, can be added directly to polycarbonate A) without pretreatment if an anhydride-modified alpha-olefin polymer C) is added simultaneously. Even though the talc is unsized, there is sufficient adsorption of the wax C) on the surface of the talc B) in the course of mixing of components A) to D) ("in situ sizing"). The object is thus also achieved by the use of anhydride-modified alpha-olefin polymer having an acid number, determined by means of potentiometric titration with alcoholic potassium hydroxide solution according to DIN ISO 17025:2005, of at least 30 mg KOH/g and an average molecular weight MW of 4000 to 40 000 g/mol, where the average molecular weight MW is determined by means of gel permeation chromatography in ortho-dichlorobenzene at 150° C. with polystyrene calibration, for stabilization of polycarbonate in a composition to which unsized talc is added, wherein, for every 10 parts by weight of the unsized talc, 0.10 to 1.4 parts by weight, preferably 0.3 to 1.0 part by weight, of the anhydride-modified alpha-olefin polymer are used. Preferably, the composition does not contain any polyester or any graft polymer, and most preferably no impact modifier at all apart from the anhydride-modified alpha-olefin polymer, which is sometimes described in the literature as an impact modifier, of component C). It is a feature of the substrate material that it is actually even possible in this way to improve the properties such as good processibility, high stiffness and good impact resistance of the polycarbonate/talc compositions with respect to the prior art. This makes it possible to avoid the additional step of pretreatment of the talc or talc mixture B) with a size, and hence to provide a composition that can be produced in a less costly and more efficient manner.

According to the invention, it is especially surprising that, in spite of the addition of the wax and talc to the polycarbonate, the metal adhesion of the substrate layer is not worsened. Polycarbonate as homopolymer already has very good metal adhesion overall. It was therefore surprising that the addition of components B) and C) has only minor effects on these properties.

At the same time, it is likewise surprising that the addition of the wax to copolycarbonates of high heat distortion resistance, for example copolycarbonate based on bisphenol A and bisphenol TMC, likewise leads to good results in relation to the properties of the substrate layer. Since the addition of the specific waxes would generally lower the thermal stability or heat distortion resistance of these copolycarbonates, the person skilled in the art would not consider the corresponding addition for substrate layers of a multilayer body. However, it was possible to obtain good profiles of properties overall in which good thermal stability and heat distortion resistance, good dimensional stability on heating (CLTE), improved surface quality, good, preferably improved, metal adhesion were still achieved with simultaneously good mechanical properties. Thus, the substrate layer thus obtained, even with use of copolycarbonates, especially of copolycarbonates comprising bisphenol TMC, is also of good suitability for the multilayer bodies described here.

In spite of the known anisotropy of the CLTE of talc-containing thermoplastic moulding compounds, the multilayer bodies described in the present invention can be used for high-precision components of lights such as reflectors and other optical elements, since thermal expansion is lowered to a low level overall and the multilayer bodies have high surface quality.

The present invention therefore provides a multilayer body comprising

I) a substrate layer (S),
II) a metal layer (M) bonded directly thereto and
III) optionally a protective layer (P) atop the metal layer, wherein the substrate layer comprises a composition obtainable by mixing components A) to D), wherein A) is a polycarbonate,
B) is an unsized talc having a median particle diameter D50 of 0.01 to 9.5 μm, where the particle diameter D50 is determined by sedimentation analysis,
C) is at least one anhydride-modified alpha-olefin polymer having an acid number of at least 30 mg KOH/g, determined by means of potentiometric titration with alcoholic potassium hydroxide solution according to DIN ISO 17025:2005, and an average molecular weight MW of 4000 to 40 000 g/mol, where the average molecular weight MW is determined by means of gel permeation chromatography in ortho-dichlorobenzene at 150° C. with polystyrene calibration,
and
optionally D) a portion of the amount of component B) may be replaced by at least one further filler selected from the group consisting of an expanded graphite having a particle diameter D50 of less than 800 μm or a mixture of the aforementioned expanded graphite with unexpanded graphite and a boron nitride as further filler, where, in the case of graphite, up to 8 parts by weight of the amount of component B) may be replaced and where, in the case of boron nitride, up to 15 parts by weight of the amount of component B) may be replaced,
wherein the amounts of components B) and C) prior to mixing with component C) are matched to one another such that, for every 10 parts by weight of component B), 0.10 to 1.4 parts by weight of component C) are used, and wherein the composition is free of graft polymers and polyesters. Component C) in the context of the present invention is not an "impact modifier" as it is sometimes called in the literature.

Layers I) and II) are bonded directly. There is therefore no further layer between layers I) and II). However, this does not rule out plasma pretreatment of layer I prior to the metallization.

In the context of the present invention, the term "mixing" preferably means the "contacting" of components A) to D). Preference is given to using mechanical aids for this purpose. The mixing takes place at temperatures where component A) has at least partly melted. The mixing preferably takes place at temperatures in the range from 250° C. to 350° C. Particular preference is given to temperatures of 260° C. to 310° C. for essentially bisphenol A-based polycarbonates. "Essentially" here means a proportion of preferably at least 90% by weight, further preferably at least 95% by weight, most preferably at least 98% by weight, of bisphenol A, based on the total amount of diphenols used. For copolycarbonates with, for example, diphenols selected from 1,1-bis(4-hydroxyphenyl)-3,3,5-trimethylcyclohexane, diphenols of the formulae (I), (II) and/or (III) shown below and/or siloxane-containing copolycarbonates, the temperatures are preferably in the range from 280° C. to 350° C. The mixing can be conducted in customary compounding units. Preference is given to screw extruders, ring extruders or (co-)kneaders.

Substrate Layer I
Component A)
Component A) is at least one polycarbonate. It is thus also possible to use mixtures as component A). For the purposes of the present invention, polycarbonates are either homopolycarbonates or copolycarbonates; the polycarbonates can, as is known, be linear or branched. Preferably, the at least one polycarbonate is an aromatic polycarbonate. Copolycarbonates are also understood to mean siloxane-containing polycarbonates.

The polycarbonates are prepared in a known manner from diphenols, carbonic acid derivatives, and optionally chain terminators and branching agents. In the case of homopolycarbonates, only one diphenol is employed and, in the case of copolycarbonates, two or more diphenols are employed. For preparation of the copolycarbonates according to the invention, it is likewise possible to use 1% to 25% by weight, preferably 2.5% to 25% by weight, based on the total amount of diphenols to be used, of polydiorganosiloxanes having hydroxyaryloxy end groups. These are known (e.g. U.S. Pat. No. 3,419,634 A) and can be prepared by processes known from the literature. Likewise suitable are polydiorganosiloxane-containing copolycarbonates; the preparation of the polydiorganosiloxane-containing copolycarbonates is described in DE-A 3 334 782 for example.

Polycarbonates are prepared for example by reaction of diphenols with carbonyl halides, preferably phosgene, and/or with dicarbonyl dihalides, preferably aromatic dicarbonyl dihalides, preferably benzenedicarbonyl dihalides, by the interfacial process, optionally with use of chain terminators and optionally with use of trifunctional or more than trifunctional branching agents. Another possibility is preparation by way of a melt polymerization process via reaction of diphenols with, for example, diphenyl carbonate.

Diphenols suitable for preparing polycarbonates are for example hydroquinone, resorcinol, dihydroxydiphenyls, bis(hydroxyphenyl)alkanes, bis(hydroxyphenyl)cycloalkanes, bis(hydroxyphenyl) sulfides, bis(hydroxyphenyl) ethers, bis(hydroxyphenyl) ketones, bis(hydroxyphenyl) sulfones, bis(hydroxyphenyl) sulfoxides, α,α'-bis(hydroxyphenyl)diisopropylbenzenes, phthalimidines derived from isatin derivatives or from phenolphthalein derivatives, and also the related ring-alkylated, ring-arylated and ring-halogenated compounds.

Preferred diphenols are selected from at least one from the group of 4,4'-dihydroxydiphenyl, 2,2-bis(4-hydroxyphenyl) propane (bisphenol A), 2,4-bis(4-hydroxyphenyl)-2-methylbutane, 1,1-bis(4-hydroxyphenyl)-p-diisopropylbenzene, 2,2-bis(3-methyl-4-hydroxyphenyl)propane, dimethylbisphenol A, bis(3,5-dimethyl-4-hydroxyphenyl)methane, 2,2-bis(3,5-dimethyl-4-hydroxyphenyl)propane, bis(3,5-dimethyl-4-hydroxyphenyl)sulfone, 2,4-bis(3,5-dimethyl-4-hydroxyphenyl)-2-methylbutane, 1,1-bis(3,5-dimethyl-4-hydroxyphenyl)-p-diisopropylbenzene and 1,1-bis(4-hydroxyphenyl)-3,3,5-trimethylcyclohexane, and also the diphenols (I) to (III)

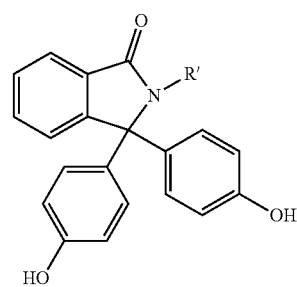

(I)

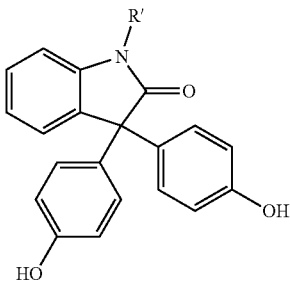

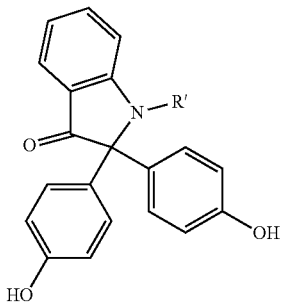

in which R' in each case is $C_1$- to $C_4$-alkyl, aralkyl or aryl, preferably methyl or phenyl, most preferably methyl.

Particularly preferred diphenols are selected from at least one from the group consisting of 2,2-bis(4-hydroxyphenyl)propane (bisphenol A), 2,2-bis(3,5-dimethyl-4-hydroxyphenyl)propane, 1,1-bis(4-hydroxyphenyl)cyclohexane, 1,1-bis(4-hydroxyphenyl)-3,3,5-trimethylcyclohexane, dimethylbisphenol A and the diphenols of the formulae (I), (II) and/or (III).

These and other suitable diphenols are described for example in U.S. Pat. Nos. 3,028,635, 2,999,825, 3,148,172, 2,991,273, 3,271,367, 4,982,014 and 2,999,846, in DE-A 1 570 703, DE-A 2 063 050, DE-A 2 036 052, DE-A 2 211 956 and DE-A 3 832 396, in FR-A 1 561 518, in the monograph "H. Schnell, Chemistry and Physics of Polycarbonates, Interscience Publishers, New York 1964" and also in JP-A 62039/1986, JP-A 62040/1986 and JP-A 105550/1986.

Examples of suitable carbonic acid derivatives include phosgene or diphenyl carbonate.

Suitable chain terminators that may be used in the preparation of the polycarbonates used in accordance with the invention are monophenols. Suitable monophenols are for example phenol itself, alkylphenols such as cresols, p-tert-butylphenol, cumylphenol and mixtures thereof.

Preferred chain terminators are the phenols mono- or polysubstituted by linear or branched $C_1$- to $C_{30}$-alkyl radicals, preferably unsubstituted or tert-butyl-substituted. Particularly preferred chain terminators are phenol, cumylphenol and/or p-tert-butylphenol.

The amount of chain terminator to be employed is preferably 0.1 to 5 mol % based on the moles of diphenols employed in each case. The chain terminators can be added before, during or after the reaction with a carbonic acid derivative.

Suitable branching agents are the trifunctional or more than trifunctional compounds known in polycarbonate chemistry, in particular those having three or more than three phenolic OH groups.

Examples of suitable branching agents include 1,3,5-tri(4-hydroxyphenyl)benzene, 1,1,1-tri(4-hydroxyphenyl)ethane, tri(4-hydroxyphenyl)phenylmethane, 2,4-bis(4-hydroxyphenylisopropyl)phenol, 2,6-bis(2-hydroxy-5'-methylbenzyl)-4-methylphenol, 2-(4-hydroxyphenyl)-2-(2,4-dihydroxyphenyl)propane, tetra(4-hydroxyphenyl)methane, tetra(4-(4-hydroxyphenylisopropyl)phenoxy)methane and 1,4-bis((4',4''-dihydroxytriphenyl)methyl)benzene and 3,3-bis(3-methyl-4-hydroxyphenyl)-2-oxo-2,3-dihydroindole.

The amount of the branching agents that are optionally to be employed is preferably from 0.05 mol % to 2.00 mol % based on the moles of diphenols employed in each case.

The branching agents can either be initially charged with the diphenols and the chain terminators in the aqueous alkaline phase or added dissolved in an organic solvent before the phosgenation. In the case of the transesterification process, the branching agents are employed together with the diphenols.

Preferred modes of production of the polycarbonates for use in accordance with the invention, including the polyestercarbonates, are the known interfacial process and the known melt transesterification process (cf. for example WO 2004/063249 A1, WO 2001/05866 A1, WO 2000/105867, U.S. Pat. Nos. 5,340,905, 5,097,002, 5,717,057).

In the first case, the acid derivatives used are preferably phosgene and optionally dicarbonyl dichlorides; in the latter case, they are preferably diphenyl carbonate and optionally dicarboxylic diesters. Catalysts, solvents, workup, reaction conditions etc. for the polycarbonate preparation or polyestercarbonate preparation have been described and are known to a sufficient degree in both cases.

Particularly preferred polycarbonates are the homopolycarbonate based on bisphenol A, the homopolycarbonate based on 1,1-bis(4-hydroxyphenyl)-3,3,5-trimethylcyclohexane, and also copolycarbonates based on the two monomers bisphenol A and 1,1-bis(4-hydroxyphenyl)-3,3,5-trimethylcyclohexane. Likewise preferred are siloxane-containing polycarbonates as described above, more preferably formed from dimethylsiloxanes with bisphenol A as monomer units.

The thermoplastic polycarbonates, including the thermoplastic, aromatic polyester carbonates, preferably have average molecular weights Mw, determined by means of gel permeation chromatography, of 15 000 g/mol to 40 000 g/mol, further preferably of 18 000 g/mol to 33 000 g/mol, more preferably of 22 000 g/mol to 32 000 g/mol, most preferably of 23 000 g/mol to 25 000 g/mol. Calibration is effected with linear polycarbonates (formed from bisphenol A and phosgene) of known molar mass distribution from PSS Polymer Standards Service GmbH, Germany, calibration by method 2301-0257502-09D (2009, German language) from Currenta GmbH & Co. OHG, Leverkusen. The eluent is dichloromethane. Column combination of cross-linked styrene-divinylbenzene resins. Diameter of analytical columns: 7.5 mm; length: 300 mm. Particle sizes of the column material: 3 μm to 20 μm. Concentration of solutions: 0.2% by weight. Flow rate: 1.0 ml/min, temperature of solutions: 30° C. Detection using a refractive index (RI) detector.

The thermoplastic polycarbonates generally have an MVR (melt volume flow rate) of 2-40 $cm^3/10$ min, preferably 3-38 $cm^3/10$ min, more preferably 5-36 $cm^3/10$ min, determined to ISO 1133-1:2012-03 (300° C., 1.2 kg).

The siloxane-containing polycarbonates (also referred to hereinafter as SiCoPC) refer to block cocondensates having the following structural units:

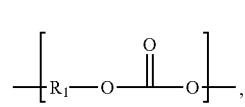

(1)

where R1 is a divalent substituted or unsubstituted aromatic radical, a divalent linear or cyclic aliphatic radical, or the structural unit (1) is a mixture of units, where R1 is a divalent substituted or unsubstituted aromatic radical or R1 is a divalent linear or cyclic aliphatic radical. The proportion of aromatic R1 radicals is preferably 60%-100% by weight and the proportion of aliphatic radicals is 0%-40% by weight, based on the sum total of diphenols of the formula (3) used in % by weight,
and

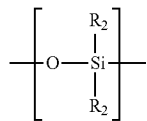

(2)

where R2 is independently a linear or branched aliphatic radical, preferably $C_1$- to $C_{12}$-alkyl, more preferably $C_1$- to $C_4$-alkyl, especially methyl, or a substituted or unsubstituted aromatic radical, preferably phenyl.

Very particularly preferred structural units (2) are dimethylsiloxane units, diphenylsiloxane units, methyl/phenylsiloxane units or mixtures of dimethylsiloxane and diphenylsiloxane units.

In the structural unit (1), R1 is preferably derived from dihydroxyaryl compounds corresponding to the formula (3):

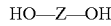

HO—Z—OH (3)

in which

Z is an aromatic radical which has 6 to 30 carbon atoms and may comprise one or more aromatic rings, may be substituted and may comprise aliphatic radicals or alkylaryls or heteroatoms as bridging elements.

Preferably, Z in formula (3) is a radical of the formula (3a)

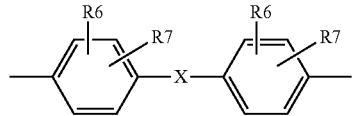

(3a)

in which

R6 and R7 are independently H, $C_1$- to $C_{18}$-alkyl, $C_1$- to $C_{18}$-alkoxy, halogen such as Cl or Br, or in each case optionally substituted aryl or aralkyl, preferably independently H or $C_1$- to $C_{12}$-alkyl, more preferably H or $C_1$- to $C_8$-alkyl and most preferably independently H or methyl, and X is —CO—, —O—, —S—, $C_1$- to $C_6$-alkylene, $C_2$- to $C_6$-alkylidene, $C_6$- to $C_{10}$-cycloalkylidene, or is $C_6$- to $C_{12}$-arylene which may optionally be fused to further aromatic rings containing heteroatoms.

Preferably, X is $C_1$- to $C_5$-alkylene, $C_2$- to $C_5$-alkylidene, $C_6$- to $C_9$-cyclohexylidene, —O—, —SO—, —CO—, —S—, —$SO_2$—, more preferably isopropylidene, 3,3,5-trimethylcyclohexylidene or —O—, especially isopropylidene.

Examples of diphenols of formula (3) that are suitable for the production of the SiCoPCs according to the invention include hydroquinone, resorcinol, bis(hydroxyphenyl)alkanes, bis(hydroxyphenyl) sulfides, bis(hydroxyphenyl) ethers, bis(hydroxyphenyl) ketones, bis(hydroxyphenyl) sulfones, bis(hydroxyphenyl) sulfoxides, [alpha],[alpha]'-bis(hydroxyphenyl)diisopropylbenzenes and also the alkylated, ring-alkylated and ring-halogenated compounds thereof.

Further-preferred diphenols of the formula (3) are 4,4'-dihydroxydiphenyl, 2,2-bis(4-hydroxyphenyl)-1-phenylpropane, 1,1-bis(4-hydroxyphenyl)phenylethane, 2,2-bis(4-hydroxyphenyl)propane, 2,2-bis(3-methyl-4-hydroxyphenyl)propane, 2,4-bis(4-hydroxyphenyl)-2-methylbutane, 1,3-bis[2-(4-hydroxyphenyl)-2-propyl]benzene (bisphenol M), 2,2-bis(3-methyl-4-hydroxyphenyl)propane, bis(3,5-dimethyl-4-hydroxyphenyl)methane, 2,2-bis(3,5-dimethyl-4-hydroxyphenyl)propane, bis(3,5-dimethyl-4-hydroxyphenyl) sulfone, 2,4-bis(3,5-dimethyl-4-hydroxyphenyl)-2-methylbutane, 1,3-bis[2-(3,5-dimethyl-4-hydroxyphenyl)-2-propyl]benzene, 1,1-bis(4-hydroxyphenyl)cyclohexane and 1,1-bis(4-hydroxyphenyl)-3,3,5-trimethylcyclohexane.

Particularly preferred diphenols of the formula (3) are 2,2-bis(4-hydroxyphenyl)propane (BPA), hydroquinone, 1,1-bis(4-hydroxyphenyl)-3,3,5-trimethylcyclohexane and 2,2-bis(3-methyl-4-hydroxyphenyl)propane.

These and further suitable diphenols are commercially available and are described, for example, in "H. Schnell, Chemistry and Physics of Polycarbonates, Interscience Publishers, New York 1964, p. 28 ff; p. 102 ff", and in "D. G. Legrand, J. T. Bendler, Handbook of Polycarbonate Science and Technology, Marcel Dekker New York 2000, p. 72 ff."

In one embodiment, the siloxane block may have the following structure (4)

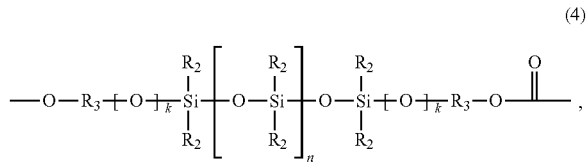

(4)

where R2 has the definition given above, n is an average number from 10 to 400, preferably 10 to 100, more preferably 15 to 50, and k is 0 or 1.

R3 independently comprises the following structural elements (5) or (6):

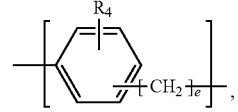

(5)

where R4 is independently hydrogen, halogen and/or in each case a $C_1$ to $C_{10}$, preferably a $C_1$ to $C_4$, linear or branched, unsubstituted or mono- to tetrasubstituted alkyl radical or alkoxy radical, the alkyl and alkoxy radicals preferably being unsubstituted, and R4 especially preferably being hydrogen, e is 0 or a natural number from 2 to 12, preferably 2 to 6, where, in the case that e is 0, k is 1;

or structural element of the formula (6)

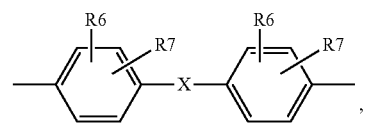

(6)

where R6, R7 and X have the definitions given in formula (3a).

For example and with preference, the siloxane block may comprise the following structures:

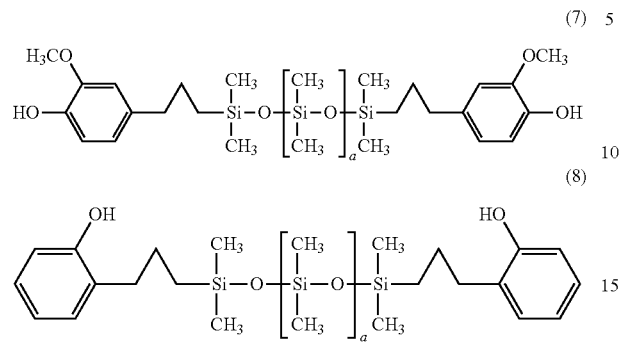

where a in the formulae (7) and (8) is an average number from 10 to 400, preferably 10 to 100 and more preferably 15 to 50.

In a further embodiment, the abovementioned siloxane blocks can be joined singly or multiply via terephthalic acid or isophthalic acid to form the following structural elements shown by way of example:

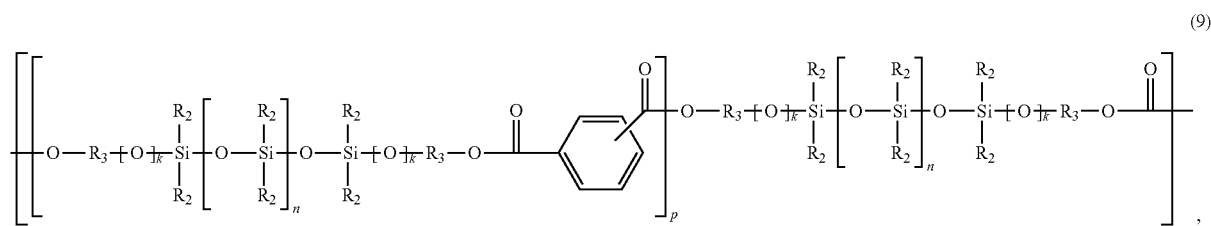

where p is 0 or 1,
R2, R3, n and k have the definitions given above for the structural element (4).

Corresponding siloxane blocks for reaction with polycarbonate or for reaction with diphenols of the formula (3) or (3a) with phosgene or diaryl carbonates each have terminal phenolic OH groups, i.e.

Formula (9)

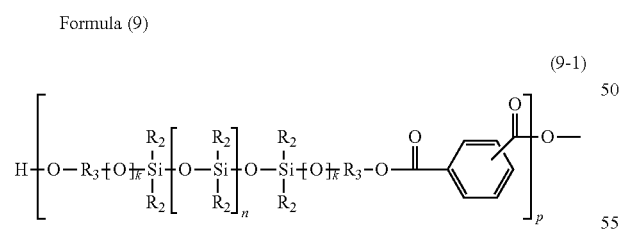

the formula is continued at the oxygen atom —R3:

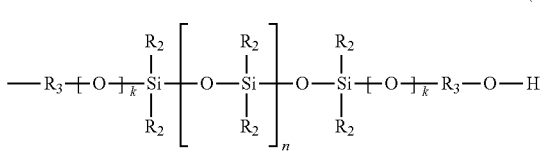

owing to the length of the formula, the formula (9) was divided: formula (9-2) is the continuation of formula (9-1) where R2, R3, n, k and p have the definitions given for the structural element (9).

Preferred siloxane blocks are hydroxyaryl-terminated polysiloxane and correspond to the formula (10)

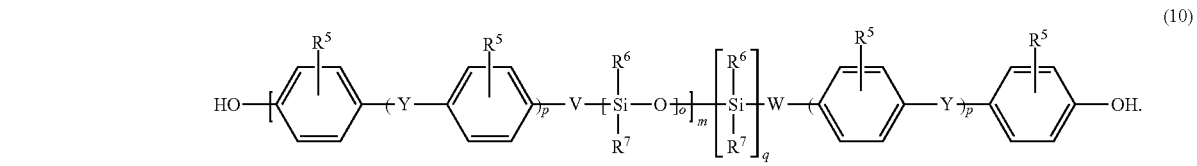

In the general formula (10), R5 is hydrogen or $C_1$- to $C_4$-alkyl, $C_1$- to $C_4$-alkoxy, preferably hydrogen or methyl, methyloxy, more preferably hydrogen.

$R^6$ and $R^7$ are independently aryl, preferably phenyl, $C_1$- to $C_4$-alkyl, preferably methyl, especially methyl.

Y is a single bond, —CO—, —O—, $C_1$- to $C_5$-alkylene, $C_2$- to $C_5$-alkylidene or a $C_5$- to $C_6$-cycloalkylidene radical which may be mono- or polysubstituted by $C_1$- to $C_4$-alkyl, preferably a single bond, —O—, isopropylidene or a $C_5$- to $C_6$-cycloalkylidene radical which may be mono- or polysubstituted by $C_1$- to $C_4$-alkyl, and especially isopropylidene.

V is oxygen, $C_1$- to $C_6$-alkylene or $C_2$- to $C_5$-alkylidene, preferably a single bond, oxygen, $C_3$-alkylene, especially oxygen or isopropylidene.

W is a single bond, S, $C_1$- to $C_6$-alkylene or $C_2$- to $C_5$-alkylidene, preferably a single bond, $C_3$-alkylene or isopropylidene, where W is not a single bond when q is 1.

p and q are each independently 0 or 1.

o is an average number of repeat units from 10 to 400, preferably 10 to 100, more preferably from 15 to 50, and m is an average number from 1 to 10, preferably from 1 to 6 and more preferably from 1.5 to 5.

Especially preferred are siloxanes of the formulae (11) and (12)

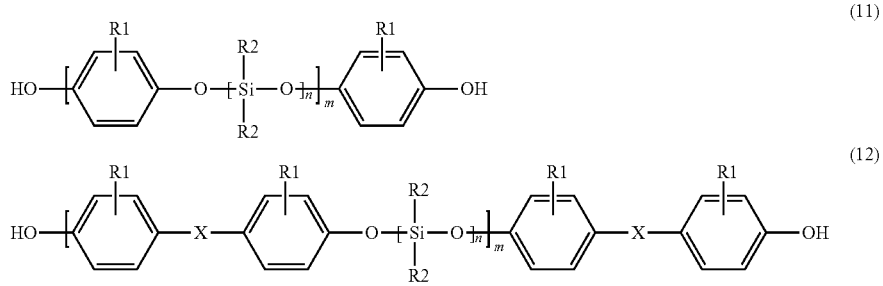

where R1 is H, Cl, Br or $C_1$- to $C_4$-alkyl, preferably H or methyl, and especially preferably hydrogen, R2 is aryl or $C_1$- to $C_4$-alkyl, preferably methyl, X is a single bond, —$SO_2$—, —CO—, —O—, —S—, $C_1$- to $C_6$-alkylene, $C_2$- to $C_5$-alkylidene, or is $C_6$- to $C_{12}$-arylene which may optionally be fused to further aromatic rings containing heteroatoms.

Preferably, X is a single bond, isopropylidene, 3,3,5-trimethylcyclohexylidene or oxygen, and most preferably isopropylidene, n is an average number from 10 to 400, preferably 10 to 100, more preferably 10 to 50, m is an average number from 1 to 10, preferably from 1 to 6 and especially preferably from 1.5 to 5. The molecular weight of the siloxane blocks is 3000 g/mol to 20 000 g/mol, preferably 3500 g/mol to 15 000 g/mol, determined by means of gel permeation chromatography (GPC) and polycarbonate from bisphenol A as diphenol as standard, as described above.

The preparation of the siloxane blocks is known in principle and they can be prepared by processes as described, for example, in US 2013/0267665 A1.

The preparation of polycarbonates is likewise known. The polycarbonates are prepared in a known manner from diphenols, carbonic acid derivatives, and optionally chain terminators and branching agents.

Details of the production of polycarbonates have been set out in many patent specifications during the last approximately 40 years. Reference may be made here merely by way of example to Schnell, "Chemistry and Physics of Polycarbonates", Polymer Reviews, Volume 9, Interscience Publishers, New York, London, Sydney 1964, to D. Freitag, U. Grigo, P. R. Müller, H. Nouvertne', BAYER AG, "Polycarbonates" in Encyclopedia of Polymer Science and Engineering, Volume 11, Second Edition, 1988, pages 648-718, and finally to Dres. U. Grigo, K. Kirchner and P. R. Müller "Polycarbonate [Polycarbonates]" in Becker/Braun, Kunststoff-Handbuch [Plastics handbook], Volume 3/1, Polycarbonate, Polyacetale, Polyester, Celluloseester [Polycarbonates, polyacetals, polyesters, cellulose esters], Carl Hanser Verlag Munich, Vienna 1992, pages 117-299.

Preferred modes of preparation for polycarbonates are the known interfacial process and the known melt transesterification process (for example WO 2004/063249 A1, WO 2001/05866 A1, WO 2000/105867, U.S. Pat. Nos. 5,340,905, 5,097,002, 5,717,057).

The content of siloxane blocks in the SiCoPC is greater than 0%, preferably 0.5% to 40% by weight, preferably 1% to 20% by weight, especially preferably 2% to 15% by weight and most preferably 2% to 10% by weight, based in each case on the siloxane blocks used and polycarbonate blocks. Correspondingly, the proportion of polycarbonate blocks in the block cocondensate is 60% to less than 100% (preferably 99.5%) by weight, preferably 99% to 80% by weight, especially preferably 98% to 85% by weight and most preferably 98% to 90% by weight.

The abovementioned siloxane blocks are preferably reacted with polycarbonates having molecular weights of 15 000 to 27 000 g/mol, especially preferably of 17 000 to 27 000 g/mol and especially preferably of 18 000 to 26 500 g/mol (measured by means of GPC with BPA polycarbonate as standard, as described above).

The diphenols for preparation of the polycarbonates are the abovementioned structural units (3).

The individual components (siloxane block and polycarbonate block) are reacted here by the reactive extrusion process, or alternatively the siloxane blocks with diphenols of the formula (3) are reacted with phosgene or diaryl carbonates by the known interfacial process. There are manifold descriptions of this process for polycarbonate synthesis in the literature; reference is made by way of example to H. Schnell, Chemistry and Physics of Polycarbonates, Polymer Reviews, vol. 9, Interscience Publishers, New York 1964 p. 33 ff., to Polymer Reviews, vol. 10, "Condensation Polymers by Interfacial and Solution Methods", Paul W. Morgan, Interscience Publishers, New York 1965, ch. VIII, p. 325, to Dres. U. Grigo, K. Kircher and P. R. Müller "Polycarbonate" in Becker/Braun, Kunststoff- Handbuch, volume 3/1, Polycarbonate, Polyacetale, Polyester, Celluloseester, Carl Hanser Verlag Munich, Vienna, 1992, p. 118-145, and to EP-A 0 517 044. The conversion of polyorganosiloxanes in the interfacial process is described, for example, in U.S. Pat. No. 3,821,325 A.

The SiCoPCs can be prepared in a reactive extrusion process as described, for example, in WO 2015/052110 A1.

Component B)

According to the invention, unsized talc is used as component B). This means that the talc does not have any size before being mixed with component A).

Talc in the context of the present invention is preferably a talc of essentially the same chemical composition, particle diameter, porosity and/or BET surface area, or a talc mixture.

Talc is generally a sheet silicate. It can be described as magnesium silicate hydrate having the general chemical composition $Mg_3[Si_4O_{10}(OH)_2]$. However, different types of talc contain different impurities, and so there may be deviations from this general composition.

According to the invention, the talc or talc mixture is unsized at the juncture of addition to component A) and C). In the context of the present invention, a size is considered to be a controlled (chemi- or physisorbed) enrichment of molecules other than talc, especially $Mg_3[Si_4O_{10}(OH)_2]$, at the surface. Unsized talc is thus non-surface-treated talc, meaning that, after the talc particles having the desired particle diameter have been recovered and optionally subjected to compaction, the talc preferably has not been subjected to any further process step that alters the surface of the talc in a controlled manner by chemisorption or physisorption. However, this does not rule out the unintentional arrival of impurities, dust or similar particles on parts of the surface during the further handling of the talc, provided that the surface of the talc does not lose its properties to any significant degree, especially in relation to the pH. According to the invention, the talc is only sized by the mixing with component C).

Preferably, the talc has a pH of 8 to 10, more preferably 8.5 to 9.8, even more preferably 9.0 to 9.7, where the pH is determined according to EN ISO 787-9:1995. It should be noted that EN ISO 787-9:1995 also mentions the option of addition of ethanol or other organic solvents to improve the dispersion of the solid to be analysed. Preference is given in accordance with the invention to using distilled water only for determination of the pH according to EN ISO 787-9: 1995.

Component B) preferably has an iron(II) oxide and/or iron(III) oxide content of 0.2% to 2.5% by weight, more preferably 0.3% to 2.3% by weight, most preferably from 0.3% to 2.0% by weight. This content is preferably measured by x-ray fluorescence or atomic absorption spectroscopy. It has been found that the iron oxide content in the talc has an influence on the degree of degradation of the polycarbonate. Within the range of iron oxide contents specified in accordance with the invention, particularly good results have been achieved in relation to the reduction in the degradation of the polycarbonate.

Likewise preferably, component B) has an aluminium oxide content of 0.01% to 0.5% by weight, more preferably of 0.05% to 0.48% by weight, most preferably of 0.15% to 0.45% by weight.

Component B) has a median particle diameter D50 of 0.01 to 9.5 μm, preferably 0.25 to 8.00 μm, more preferably 0.5 to 6.00 μm and most preferably 0.5 μm to not more than 3.0 μm, where the particle diameter D50 is determined by sedimentation analysis. The median D50 is understood by the person skilled in the art to mean an average particle diameter at which 50% of the particles are smaller than the defined value. Preferably, the particle diameter D50 is determined according to ISO13317-3:2001.

Component B) preferably has a BET surface area of 7.5 to 20.0 m²/g, more preferably of 9.0 to 15.0 m²/g, most preferably 9.5 to 14.0 m²/g. The determination of the surface area according to Brunauer, Emmett and Teller by means of gas adsorption is known per se to those skilled in the art. Preferably, the BET surface area of component B) is determined according to ISO 4652:2012. This preferred BET surface area is more preferably linked to the above-described median particle diameter D50 of the talc. It has been found that, in the case of such a combination, the component B) used in accordance with the invention is optimized to the component C) used in accordance with the invention. The specific acid number and molar mass of component C) can minimize the degradation of the polycarbonate caused by component B), since the pores of the talc under these conditions, in particular, are also accessible to the wax C).

More preferably, the talc has a content of ≥96% by weight, more preferably ≥97% by weight, most preferably ≥98% by weight.

It is likewise preferable that the talc has an ignition loss at 1050° C. of 5.0% to 7.0% by weight, more preferably of 5.2 to 6.5% by weight and most preferably of 5.3 to 6.2% by weight. The ignition loss is preferably determined by means of DIN51081:2002.

The talc or talc mixture of component B) is preferably in compacted form.

Component C)

Component C) in the context of the present invention is an anhydride-modified alpha-olefin polymer having an acid number of at least 30 mg KOH/g and an average molecular weight $M_W$ of 4000 to 40 000 g/mol. It may also be a mixture of various polymers that fulfil the features of component C).

The alpha-olefin polymer preferably contains at least one unit selected from the group consisting of ethylene, 1-propene, 1-butene, 1-isobutene, 1-pentene, 1-hexene, 1-heptene, 1-octene, 1-nonene, 1-decene, 1-undecene, 1-dodecene, 1-tridecene, 1-tetradecene, 1-octadecene, 1-nonadecene and mixtures of these. More preferably, the alpha-olefin polymer contains at least one unit selected from the group consisting of ethylene, 1-propene, 1-octene.

A preferred anhydride as a further unit for modification is an unsaturated carboxylic anhydride, preferably selected from at least one selected from the group consisting of maleic anhydride, phthalic anhydride, fumaric anhydride, itaconic anhydride. Particular preference is given to maleic anhydride.

The anhydride-modified alpha-olefin polymer is preferably rubber-free.

Preferably, the alpha-olefin polymer comprises (component C)

Ca) 90.0%-98.0% by weight, preferably 92.0%-97.5% by weight, more preferably 94.0%-97.0% by weight, of alpha-olefin polymer and Cb) 2.0%-10.0% by weight, preferably 2.5%-8.0% by weight and more preferably 3.0%-6.0% by weight of anhydride.

The olefinic portion Ca) of the alpha-olefin polymer is preferably characterized in that the ethylene content is 80.0%-96.0% by weight, preferably 84.0%-92.0% by weight, the propylene content is 2.0%-10.0% by weight, preferably 4.0%-8.0% by weight, and the octene content is 2.0%-10.0% by weight, preferably 4.0%-8.0% by weight.

Likewise preferably, the olefinic portion Ca) of the alpha-olefin polymer consists of propylene and/or ethylene. Further preferably, the olefinic portion Ca) of the alpha-olefin polymer consists of propylene.

The acid number of the wax of component C) used in accordance with the invention is at least 30 mg KOH/g. Preferably, the acid number is 30 to 110 mg KOH/g, more preferably 40 to 95 mg KOH/g. The acid number was determined by Currenta GmbH by means of potentiometric titration with alcoholic potassium hydroxide solution according to DIN ISO 17025:2005.

The average molecular weight $M_W$ of the anhydride-modified alpha-olefin polymer is 4000 to 40 000 g/mol, preferably 4000 to 32 000 g/mol, more preferably 4800 to 25 000 g/mol. The molecular weight $M_W$ is determined by means of gel permeation chromatography in ortho-dichlorobenzene at 150° C. with polystyrene calibration. The value reported here is preferably the mean from a double determination.

Preferably, in the case of smaller molecular weights of 4000 to 10 000 g/mol, the acid number is 30 to 65 mg, more preferably 40 to 60 mg KOH/g. More preferably, the molecular weight for the acid number of 30 mg to 65 mg or 40 to 60 mg KOH/g specified in each case is 4500 to 8000 g/mol and especially 5000 to 7000 g/mol.

Preferably, in the case of larger molecular weights of 12 000 to 40 000 g/mol, the acid number is 30 to 100 mg KOH/g, more preferably 35 to 95 mg KOH/g. More preferably, the molecular weight for the acid number of 30 mg to 100 mg or 35 to 95 mg KOH/g specified in each case is 12 000 to 32 000 g/mol and especially 15 000 to 25 000 g/mol, most preferably 17 500 to 23 000 g/mol.

The combination of the (minimum) acid number and molar mass of the wax C) as specified above is particularly suitable in order to optimize, in particular, the multiaxial impact resistance of moulded articles produced from the compositions according to the invention.

Component D

As optional component D), useful further fillers are expanded graphite alone or in a mixture with unexpanded graphite and/or boron nitride.

Expanded Graphite:

Graphite is used as component D, preferably expanded graphite, alone or in a mixture with unexpanded graphite, more preferably solely expanded graphite.

In the expanded graphites the individual basal planes of the graphite have been driven apart by a special treatment which results in an increase in volume of the graphite, preferably by a factor of 200 to 400. The production of expanded graphites is described inter alia in documents U.S. Pat. Nos. 1,137,373 A, 1,191,383 A and 3,404,061 A.

Graphite is understood hereinafter to mean expanded graphite, unless reference is made explicitly to unexpanded graphite.

Graphites are used in the compositions in the form of fibres, rods, spheres, hollow spheres, platelets, in powder form, in each case either in aggregated or agglomerated form, preferably in platelet form. The platelet-shaped structure is in the present invention understood as meaning a particle having a flat geometry. Thus, the height of the particles is typically distinctly smaller compared to the breadth or length of the particles. Such flat particles may in turn be agglomerated or aggregated into constructs. The thickness of the platelet-shaped primary particles is less than 500 nm, preferably less than 200 nm and more preferably less than 100 nm. As a result of the small sizes of these primary particles, the shape of the particles may be bent, curved, waved or deformed in some other way. The length dimensions of the particles can be determined by standard methods, for example electron microscopy.

Preference is given in accordance with the invention to using a graphite having a relatively high specific surface area, determined as the BET surface area by means of nitrogen adsorption to DIN ISO 9277:2010. Preference is given to using graphites having a BET surface area of >5 m$^2$/g, more preferably >10 m$^2$/g and most preferably >18 m$^2$/g in the thermoplastic compositions.

The particle diameter D50 of the graphite, typically determined by sieve analysis according to DIN 51938:2015-09 for powders having a D50≥150 μm or by laser diffraction according to ISO 13320:2009 for powders having a D50<150 μm, is preferably <800 μm, more preferably <600 μm, even more preferably <220 μm, especially preferably <150 μm. For particularly good surface qualities, preference is given to graphites having a particle size distribution which are characterized by the D90 of <600 μm, more preferably of <300 μm. The D50 and D90 values are ascertained by sieve analysis in accordance with DIN 51938:2015-09 or by laser diffraction according to ISO 13320:2009. D50 means that 50% of the particles have a particle diameter smaller than or equal to the value specified. D90 means that 90% of the particles have a particle diameter smaller than or equal to the value specified. D0.5 and D0.9 are equivalent terms. It should be noted that, in the case of sieve analysis according to DIN 51938:2015-09, the indices D50 and D90 are based on weight (% by weight), not, as in the case of laser diffraction, on the number of particles analysed in the sample volume.

The carbon content of the graphites used in accordance with the invention determined to DIN 51903 at 800° C. for 20 hours is preferably >90% by weight, more preferably >95% by weight and yet more preferably >97% by weight.

The residual moisture content of the graphites used in accordance with the invention determined to DIN 51904: 2012-11 at 110° C. for 8 hours is preferably <5% by weight, more preferably <3% by weight and yet more preferably <2% by weight.

Commercially available expanded and unexpanded graphites include Ecophit® GFG 5, Ecophit® GFG 50, Ecophit® GFG 200, Ecophit® GFG 350, Ecophit® GFG 500 (now available under the Sigratherm® product name) from SGL Carbon GmbH, TIMREX® BNB90, TIMREX® KS5-44, TIMREX® KS6, TIMREX® KS150, TIMREX® SFG44, TIMREX® SFG150, TIMREX® C-THERM™ 001 and TIMREX® C-THERM™ 011, and C-THERM™ 002 from TIMCAL Ltd. or Imerys Graphite & Carbon Switzerland Ltd.

Boron Nitride:

According to the invention, the boron nitride used may be a cubic boron nitride, a hexagonal boron nitride, an amorphous boron nitride, a partially crystalline boron nitride, a turbostratic boron nitride, a wurtzitic boron nitride, a rhombohedral boron nitride and/or a further allotropic form, preference being given to the hexagonal form.

The preparation of boron nitride is described, for example, in documents U.S. Pat. No. 6,652,822 B2, US 2001/0021740 A1, U.S. Pat. Nos. 5,898,009 A, 6,048,511 A, US 2005/0041373 A1, US 2004/0208812 A1, U.S. Pat. No. 6,951,583 B2 and in WO 2008/042446 A2.

The boron nitride may be used in the form of platelets, powders, nanopowders, fibres and agglomerates, or a mixture of the aforementioned forms.

Preference is given to utilizing a mixture of boron nitride in the form of discrete platelets and agglomerates.

Preferred boron nitrides typically have an agglomerated particle size (D50) of 1 μm to 100 μm, preferably of 3 μm to 60 μm, more preferably of 5 μm to 30 μm, ascertained by laser diffraction according to ISO 13320:2009.

In laser diffraction, particle size distributions are determined by measuring the angular dependence of the intensity of scattered light of a laser beam penetrating through a dispersed particle sample. In this method, the Mie theory of light scattering is used to calculate the particle size distribution. The measuring instrument used may, for example, be Microtac S3500. The D50 means that 50% of all the particles that occur in the material examined are smaller than or equal to the value stated.

In a further embodiment of the present invention, boron nitrides having a D50 of 0.1 μm to 50 μm, preferably of 1 μm to 30 μm, more preferably of 3 μm to 25 μm, determined by laser diffraction as described above, are utilized, preference being given to hexagonal boron nitrides.

Boron nitrides may be used with different particle size distributions in the compositions according to the invention.

In a further embodiment of the present invention, two boron nitrides having different particle size distribution are utilized, which gives rise to a bimodal distribution in the composition.

The carbon content of the boron nitrides used is ≤1% by weight, preferably ≤0.5% by weight, more preferably ≤0.2% by weight.

The purity of the boron nitrides, i.e. the proportion of pure boron nitride in the additive utilized in each case, is at least 90% by weight, preferably at least 95% by weight and further preferably at least 97% by weight.

The boron nitrides used in accordance with the invention generally have a BET surface area, according to ISO 9277:2010, of 0.1 $m^2/g$ to 25 $m^2/g$, preferably 1.0 $m^2/g$ to 10 $m^2/g$ and more preferably 2 $m^2/g$ to 9 $m^2/g$.

The bulk density of the boron nitrides is preferably ≤1 $g/cm^3$, more preferably ≤0.8 $g/cm^3$ and most preferably ≤0.6 $g/cm^3$.

Examples of commercially usable boron nitrides are Boron Nitride Cooling Filler Platelets 009, Boron Nitride Cooling Filler Platelets 012 and Boron Nitride Cooling Filler Platelets 015/400 HR from 3M™ Technical Ceramics or CoolFlow™ Boron Nitride Powder CF500 and Cool-Flow™ Boron Nitride Powder CF600 Powder from Momentive Performance Materials. In addition, the boron nitrides may have been surface-modified, which increases the compatibility of the fillers with the composition according to the invention. Suitable modifiers include organic, for example organosilicon, compounds.

Examples of commercially usable boron nitrides are Boron Nitride Cooling Filler TP 15/400 from ESK Ceramics GmbH & Co. KG, HeBoFill® 511, HeBoFill® 501, HeBo-Fill® 483, HeBoFill® 482 from Henze Boron Nitride Products AG and CoolFlow™ CF400, CoolFlow™ CF500, CoolFlow™ CF600, and PolarTherm PT110 from Momentive Performance Materials.

In addition, the boron nitrides may have been surface-modified, which increases the compatibility of the fillers with the composition according to the invention. Suitable modifiers include organic, for example organosilicon, compounds.

Composition

In the composition according to the invention, the amounts of B) and C), prior to the mixing of components A) to C), are matched to one another such that, for every 10 parts by weight of component B), 0.10 to 1.4 parts by weight of component C) are used. Preferably, for every 10 parts by weight of component B), 0.2 to 1.2, more preferably 0.3 to 1.1, parts by weight of component C), most preferably 0.4 to 1.0 part by weight of component C), are used.

Preferably, the composition according to the invention contains 12.0% to 45.0% by weight of component B), based on the overall composition.

More preferably, the composition contains 15.0% to 42.0% by weight, most preferably 18.0% to 35.0% by weight, of component B), based in each case on the overall composition. The amount of component C) is calculated from the above-specified amounts per 10 parts by weight of component B).

Optionally, to further improve thermal conductivity and dimensional stability, it is also possible to add component D), where component D) replaces a corresponding amount of component B). When component D) is a graphite, 0.0 to 8.0 parts by weight of component B) may be replaced. When component D) is a boron nitride, 0.0 to 15.0 parts by weight of component B) may be replaced by component D). If a graphite is added as component D), preferably 2.0 to 7.0 parts by weight of B) are replaced by component D). If a boron nitride is added as component D), preferably 2.0 to 12.0 parts by weight of B) are replaced by component D).

The composition is free of graft polymers and polyesters, preferably of impact modifiers other than component C).

"Graft polymers" are especially understood to mean graft polymers having elastomeric properties that are obtainable essentially from at least two of the following monomers: chloroprene, 1,3-butadiene, isoprene, styrene, acrylonitrile, ethylene, propylene, vinyl acetate and (meth)acrylic esters having 1 to 18 carbon atoms in the alcohol component, i.e. polymers as described, for example, in "Methoden der Organischen Chemie" [Methods of Organic Chemistry] (Houben-Weyl), vol. 14/1, Georg Thieme-Verlag, Stuttgart 1961, p. 393-406 and in C. B. Bucknall, "Toughened Plastics", Appl. Science Publishers, London 1977. Graft polymers may be partially crosslinked and have gel contents (measured in toluene) of more than 20% by weight, preferably more than 40% by weight, especially more than 60% by weight, where the gel content is determined at 25° C. in a suitable solvent (M. Hoffmann, H. Krömer, R. Kuhn, Polymeranalytik I und II [Polymer Analysis I and II], Georg Thieme-Verlag, Stuttgart 1977).

Graft polymers are, for example, graft polymers of:

a.i) 5 to 95 parts by weight, preferably 30 to 80 parts by weight, of a mixture of a.i.1) 50 to 95 parts by weight of styrene, α-methylstyrene, methyl ring-substituted styrene, $C_1$- to $C_8$-alkyl methacrylate, especially methyl methacrylate, $C_1$- to $C_8$-alkyl acrylate, especially methyl acrylate, or mixtures of these compounds, and a.i.2) 5 to 50 parts by weight of acrylonitrile, methacrylonitrile, $C_1$- to $C_8$-alkyl methacrylates, especially methyl methacrylate, $C_1$- to $C_8$-alkyl acrylate, especially methyl acrylate, maleic anhydride, $C_1$- to $C_4$-alkyl- or phenyl-N-substituted maleimides or mixtures of these compounds, a.ii) 5 to 95 parts by weight, preferably 20 to 70 parts by weight, of a rubber-containing graft base.

Graft polymers are especially those having a graft base based on a polybutadiene rubber.

Graft polymers are, for example, styrene- and/or acrylonitrile- and/or alkyl (meth)acrylate-grafted polybutadienes, butadiene/styrene copolymers and acrylate rubbers; i.e. copolymers of the type described in DE-A 1 694 173

(=U.S. Pat. No. 3,564,077); polybutadienes grafted with alkyl acrylates or methacrylates, vinyl acetate, acrylonitrile, styrene and/or alkylstyrenes, butadiene/styrene or butadiene/acrylonitrile copolymers, polyisobutenes or polyisoprenes, as described, for example, in DE-A 2 348 377 (=U.S. Pat. No. 3,919,353).

Graft polymers are especially also those obtainable by grafting reaction of

I. at least one (meth)acrylic ester or a mixture of acrylonitrile or (meth)acrylic ester and styrene on II. a butadiene polymer with butadiene radicals as graft base.

(Meth)acrylic esters I are esters of acrylic acid or methacrylic acid and monohydric alcohols having 1 to 18 carbon atoms, especially methyl, ethyl and propyl methacrylate.

The graft base II may, as well as butadiene radicals, also contain radicals of other ethylenically unsaturated monomers, such as styrene, acrylonitrile, esters of acrylic or methacrylic acid having 1 to 4 carbon atoms in the alcohol component (such as methyl acrylate, ethyl acrylate, methyl methacrylate, ethyl methacrylate), vinyl esters and/or vinyl ethers. A graft base II consists, for example, of pure polybutadiene.

Since, as is well known, the graft monomers are not necessarily entirely grafted onto the graft base in the grafting reaction, graft polymers B are also understood in accordance with the invention to include those products obtained by polymerization of the graft monomers in the presence of the graft base.

Graft polymers are, for example, also graft polymers of (a) acrylate rubber as graft base and (b) a polymerizable, ethylenically unsaturated monomer, and the homopolymers or copolymers thereof formed in the absence of a) as graft monomers.

The acrylate rubbers (a) of the graft polymer are especially polymers of alkyl acrylates, optionally with other polymerizable, ethylenically unsaturated monomers.

Polymerizable acrylic esters are $C_1$- to $C_8$-alkyl esters, for example methyl, ethyl, n-butyl, n-octyl and 2-ethylhexyl esters and mixtures of these monomers.

Monomers having more than one polymerizable double bond can be copolymerized for crosslinking purposes.

Examples of crosslinking monomers are esters of unsaturated monocarboxylic acids having from 3 to 8 carbon atoms and of unsaturated monohydric alcohols having from 3 to 12 carbon atoms, or of saturated polyols having from 2 to 4 OH groups and from 2 to 20 carbon atoms, for example ethylene glycol dimethacrylate, allyl methacrylate; polyunsaturated heterocyclic compounds, for example trivinyl and triallyl cyanurate; polyfunctional vinyl compounds, such as di- and trivinylbenzenes; and also triallyl phosphate and diallyl phthalate.

Examples of preferred "other" polymerizable, ethylenically unsaturated monomers which can optionally serve alongside the acrylic esters for production of the graft base (a) are acrylonitrile, styrene, α-methylstyrene, acrylamides, vinyl $C_1$-$C_6$-alkyl ethers, methyl methacrylate, butadiene.

Examples of corresponding impact modifiers are ABS (acrylonitrile-butadiene-styrene), SBR (styrene-butadiene rubber) and SAN (styrene-acrylonitrile).

Impact modifiers are also vinyl (co)polymers.

Graft bases are also silicone rubbers.

Impact modifiers are also core-shell systems, for example silicone-acrylic impact modifiers, for instance with a silicone elastomer core and MMA copolymer shell, such as Metablen S-2001.

Impact modifiers are also optionally functionalized polyolefins of higher molecular weight, including both homo- and copolymers other than component C). In the case of these, the functionalization is effected, for example, by means of aromatic monovinyl monomers, acrylic acids and methacrylic acids and/or esters thereof, conjugated dienes.

Polyesters typically used as impact modifiers are preparable in the broadest sense as condensates from dicarboxylic acids and diols (dialcohols), especially polyethylene terephthalate, polybutylene terephthalate and polyethylene naphthalate, or the copolyester Tritan from Eastman Chemical Company.

More preferably, the composition consists essentially of components A) to C), although customary additives listed hereinafter may be present, and in principle also further constituents that do not have any adverse effect on the desired properties, especially the multiaxial impact resistance. Most preferably, the composition consists of components A) to C) and the additives mentioned below, and is thus especially free of impact modifiers other than component C). "Other than component C)" is referred to as such since anhydride-modified alpha-olefin polymers are sometimes referred to in the literature as impact modifier, but in that case typically in higher amounts and/or with a higher average molecular weight.

The composition according to the invention preferably comprises at least one additive selected from the group consisting of flame retardants, antidripping agents, thermal stabilizers, demoulding agents, antioxidants, UV absorbers, IR absorbers, antistats, optical brighteners, opacifiers, colorants. These further constituents may be added prior to the mixing of components A) to D), in the course of mixing of components A) to D), or after the mixing of components A) to D).

The additives are optionally present in the composition according to the invention at up to 10.0% by weight, preferably to an extent of 0.10% to 8.0% by weight, more preferably to an extent of 0.2% to 3.0% by weight, where these percentages by weight are based on the total mass of the composition.

Those additives as typically added in the case of polycarbonates are described, for example, in EP-A 0 839 623, WO-A 96/15102, EP-A 0 500 496 or in "Plastics Additives Handbook", Hans Zweifel, 5th Edition 2000, Hanser Verlag, Munich.

Preferred demoulding agents are esters of aliphatic long-chain carboxylic acids with mono- or polyhydric aliphatic and/or aromatic hydroxyl compounds. Particular preference is given to pentaerythritol tetrastearate, glycerol monostearate, stearyl stearate and propanediol distearate or mixtures thereof.

Preferred UV stabilizers have minimum transmittance below 400 nm and maximum transmittance above 400 nm. Ultraviolet absorbers particularly suitable for use in the composition according to the invention are benzotriazoles, triazines, benzophenones and/or arylated cyanoacrylates.

Particularly suitable ultraviolet absorbers are hydroxybenzotriazoles such as 2-(3',5'-bis(1,1-dimethylbenzyl)-2'-hydroxyphenyl)benzotriazole (Tinuvin® 234, Ciba Spezialitatenchemie, Basle), 2-(2'-hydroxy-5'-(tert-octyl)phenyl) benzotriazole (Tinuvin® 329, Ciba Spezialitatenchemie, Basle), 2-(2'-hydroxy-3'-(2-butyl)-5'-(tert-butyl)phenyl)benzotriazole (Tinuvin® 350, Ciba Spezialitatenchemie, Basle), bis(3-(2H-benzotriazolyl)-2-hydroxy-5-tert-octyl)methane (Tinuvin® 360, Ciba Spezialitatenchemie, Basle), (2-(4,6-diphenyl-1,3,5-triazin-2-yl)-5-(hexyloxy)phenol (Tinuvin® 1577, Ciba Spezialitatenchemie, Basle), and the benzophenones 2,4-dihydroxybenzophenone (Chimassorb® 22, Ciba Spezialitatenchemie, Basle) and 2-hydroxy-4-(octyloxy) benzophenone (Chimassorb® 81, Ciba, Basle), 2-cyano-3, 3-diphenyl-2-propenoic acid 2-ethylhexyl ester, 2,2-bis[[(2-cyano-1-oxo-3,3-diphenyl-2-propenyl)oxy]methyl]-1,3-propanediyl ester (9CI) (Uvinul© 3030, BASF AG Ludwigshafen), 2-[2-hydroxy-4-(2-ethylhexyl)oxy]phenyl-4,6-di(4-phenyl)phenyl-1,3,5-triazine (CGX UVA 006, Ciba Spezialitatenchemie, Basle) or tetraethyl 2,2'-(1,4-phenylenedimethylidene)bismalonate (Hostavin® B-Cap, Clariant AG).

Particularly preferred specific UV stabilizers are, for example, Tinuvin® 360, Tinuvin® 350, Tinuvin® 329, Hostavin® B-CAP, more preferably TIN 329 and Hostavin® B-Cap. It is also possible to use mixtures of these ultraviolet absorbers.

Suitable UV stabilizers are preferably 2-(2'-hydroxyphenyl)benzotriazoles, 2-hydroxybenzophenones, esters of substituted and unsubstituted benzoic acids, acrylates, sterically hindered amines, oxamides, 2-(2-hydroxyphenyl)-1,3,5-triazines, particular preference being given to substituted benzotriazoles such as Tinuvin 360, Tinuvin 350, Tinuvin 234, Tinuvin 329 or UV CGX 006 (Ciba). Suitable colorants may be pigments, including inorganic pigments, carbon black and/or dyes. Fillers other than component B) may likewise be added, provided that they do not impair the level of properties of the present invention by their nature and amount. Useful inorganic fillers especially include titanium dioxide, preferably sized titanium dioxide, generally in an amount of 0% to 2.5% by weight, based on the sum total of the overall composition, or barium sulfate.

The composition may contain further customary polymer additives such as flame retardants, flame retardant synergists, antidripping agents (for example compounds from the substance classes of the fluorinated polyolefins and the silicones), nucleating agents, antistats (such as polyalkylene ethers, alkyl sulfonates or polyamide-containing polymers) in such amounts that do not impair the mechanical properties of the composition in that the target profile of properties is no longer fulfilled.

Suitable additives are described, for example, but in a non-limiting manner, in "Additives for Plastics Handbook, John Murphy, Elsevier, Oxford 1999" and in "Plastics Additives Handbook, Hans Zweifel, Hanser, Munich 2001" or in WO 99/55772, pp. 15-25.

In addition, it is possible to add further constituents which do not impair the level of properties of the present invention by the nature of the constituent and amount thereof.

The polymer compositions according to the invention, comprising the mixed components A) to D) and optionally additives and further constituents, are optionally produced using powder pre-mixes, provided that components B) and C) are indeed first mixed in the melt of component A). With this proviso, it is also possible to use pre-mixes of pellets or pellets and powders with the additives according to the invention. It is also possible to use pre-mixes which have been produced from solutions of the mix components in suitable solvents, in which case homogenization is optionally effected in solution and the solvent is then removed. In this case in particular, the further constituents of the composition according to the invention can be introduced by known processes or as a masterbatch. The use of masterbatches is especially preferred for introduction of additives and further constituents, in which case masterbatches based on the respective polymer matrix in particular are used.

The composition according to the invention can be extruded, for example. The extrudate can be cooled and comminuted after extrusion. The combining and commixing of a pre-mix in the melt can also be effected in the plastifying unit of an injection moulding machine. In this case the melt is converted into a moulded article directly in the subsequent step.

It has especially been found that the composition according to the invention is particularly suitable for the production of extrudates, preferably for the extrusion of profiles and sheets.

In the process according to the invention, components A) to D) as already elucidated in detail above can be used in all preferences and combinations. Preferably, the process according to the invention serves to produce the composition according to the invention. The sizing of the talc or talc mixture B) with at least one polycarbonate A) is effected in the melt.

The substrate layer preferably has a layer thickness of 0.1 mm to 6 mm, more preferably 0.2 mm to 4 mm.

According to the invention, the substrate layer has improved surface quality. Improved surface quality in the context of the invention is a surface that has only few to no defects or blisters and a smooth feel (low surface roughness, an average of less than 10 defects perceptible to the eye over an area of 150×105 mm$^2$).

In one embodiment, the substrate material has a CLTE of <50 ppm/K, preferably <45 ppm/K, more preferably <40 ppm/K, based on parallel thermal expansion according to DIN 53752 (1980-12), and <60, preferably <57 and more preferably <55 ppm/K based on transverse thermal expansion, and most preferably between 20 and 43 ppm/K (parallel) and 30 to 56 ppm/K (transverse), especially between 25 and 38 ppm/K (parallel) and 40 to 53 ppm/K (transverse).

In a further embodiment, the substrate material has a thermal stability or heat distortion resistance >120°, preferably 130-240° C., more preferably 140-220° C., determined according to Vicat B ISO 306, 50K/h.

In a further embodiment, the substrate material has a thermal conductivity >0.3 W/mK, preferably 0.5-4 W/mK, more preferably 0.6-3.5 W/mK, based on the "in-plane" conductivity according to ASTM 1461, and a "through-plane" conductivity according to ASTM 1461 of 0.2 to 0.5 W/mK.

Particular preference is given to multilayer bodies having a Charpy (unnotched) of >10 kJ/m$^2$.

Metal Layer II)

The multilayer body according to the invention comprises a metal layer bonded directly to the substrate layer I). This metal layer preferably comprises at least one metal selected from the group consisting of aluminium, silver, chromium, titanium and palladium. More preferably, the metal layer comprises silver or aluminium, especially preferably aluminium.

The layer thickness of the metal layer is preferably 10 nm to 1000 nm, especially preferably 50 nm to 800 nm, further preferably 60 nm to 500 nm and most preferably 60 nm to 300 nm.

The application of metals to the substrate layer I) can be accomplished via various methods, for example by vapour deposition or sputtering. The processes are described in detail, for example, in "Vakuumbeschichtung Bd.1 bis 5" [Vacuum Coating Vol. 1 to 5], H. Frey, VDI-Verlag Düsseldorf 1995 or "Oberflächen-und Dünnschicht-Technologie" [Surface and Thin-Film Technology] Part 1, R. A. Haefer, Springer Verlag 1987. Preferably, the metal layer is applied by vapour deposition or DC-sputtered (cathode atomization via DC plasma). These processes are known to those skilled in the art.

In order to achieve better metal adhesion and in order to clean the substrate surface, the substrates are normally subjected to a plasma pretreatment. These methods are described, for example, in Friedrich et al. in Metallized Plastics 5&6: Fundamental and applied aspects and H. Grünwald et al. in Surface and Coatings Technology 111 (1999) 287-296.

Protective Layer III)

In addition, the multilayer body according to the invention may comprise a protective layer III). This is preferably an anticorrosion layer and is preferably present when the metal layer of the multilayer body is exposed to weathering effects.

It may preferably be applied in a PECVD (plasma-enhanced chemical vapour deposition) or plasma polymerization process. This involves evaporating low-boiling precursors, mainly siloxane-based, into a plasma and hence activating them such that they can form a film. These precursors are preferably selected from the group consisting of hexamethyldisiloxane (HMDSO), octamethylcyclotetrasiloxane (OMCTS), octamethyltrisiloxane (OMTS), tetraethylorthosilane (TEOS), and tetramethyldisiloxane (TMDSO), decamethylcyclopentasiloxane (DMDMS), hexamethylcyclotrisiloxane (HMCTS), trimethoxymethylsilane (TMOMS) and tetramethylcyclotetrasiloxane (TMCTS).

The layer thickness of the protective layer III) is preferably 5 nm to 200 nm, more preferably 10 nm to 100 nm and most preferably 20 to 50 nm. The protective layer may consist of one or more layers.

Further Layer(s) IV)

In a further embodiment, at least one further layer (IV) may also be present. This may be at any point in the multilayer body except for between layers I) and II), which are bonded directly to one another.

The at least one further layer is preferably a layer that prevents formation of condensate on the surface (anti-fogging coatings). It is preferably located between layers II) and III).

In a preferred embodiment, the multilayer body according to the invention has a layer thickness of the substrate layer of 0.1 mm to 6.0 mm, a layer thickness of the metal layer of 10 nm to 1000 nm and/or a layer thickness of the protective layer of 5 nm to 200 nm.

The multilayer bodies according to the invention are preferably used for production of moulded articles such as reflectors and (housing) components of light sources and heat sources and displays. Moulded articles are, for example, lamp holders, lamp covers, light collection systems, collimators, and also vapour-deposited displays, a vapour-deposited panel, a lens holder, a fibre optic element, an LED socket, an LED reflector, a heat sink, a cooling element or a solar reflector, and an automobile part. The automobile parts are preferably bezels, headlamp housing and indicators.

The present invention therefore also provides the abovementioned moulded articles comprising the multilayer body according to the invention in all the individual or combined embodiments described.

Process

In a further aspect of the present invention, a process for producing the multilayer body according to the invention is provided, comprising the steps of (a) forming the substrate layer (I) by injection moulding or extrusion of the composition comprising components A) to D) and optionally further additives, preferably working with a variothermal mould regime in the injection moulding operation, (b) applying the metal layer (II) to the layer obtained in step (a) in a plasma process and (c) optionally applying at least one further layer (IV), (d) optionally applying the protective layer (III) to the composite obtained in step (b) or (c).

Step (d) should preferably be understood such that, when multiple layers are applied in step (c), the protective layer is applied in step (d) to the outermost layer, i.e. the layer furthest removed from the substrate layer obtained in step (a). The substrate layer in step (a), the metal layer in step (b), the optional at least one further layer in step (c) and the protective layer in step (d) are each layers I) to IV) as elucidated in detail above.

Use

In a further aspect, the present invention relates to the use of at least one anhydride-modified alpha-olefin polymer C) having an acid number of at least 30 mg KOH/g and an average molecular weight $M_W$ of 4000 to 25 000 g/mol, wherein the average molecular weight $M_W$ is determined by means of gel permeation chromatography in ortho-dichlorobenzene at 150° C. with polystyrene calibration, for production of a substrate layer of a multilayer body, wherein the multilayer body comprises at least the one substrate layer, a metal layer bonded directly thereto and optionally at least one protective layer atop the metal layer, and wherein the substrate layer comprises a composition which is obtained by mixing at least components A) to D), wherein A) is at least one polycarbonate and
B) is at least one kind of talc.

As already elucidated in detail above, it is possible in accordance with the invention, through the use of component C) according to the invention in all its above-described preferences, to effectively reduce the degradation of the polycarbonate A) by component B). Thus, it is possible to obtain substrate layers for multilayer bodies which have particularly good thermal stability and heat distortion resistance and simultaneously improved surface quality, good metal adhesion, and excellent dimensional stability (CLTE).

These effects can especially be achieved when the amounts of B) and C) prior to mixing are matched to one another such that, for every 10 parts by weight of component B), the abovementioned parts by weight of component C) are used.

It is likewise particularly preferable for the reasons already elucidated above that the talc or talc mixture of component B) is unsized. It is likewise preferable that the talc or talc mixture of component B) has a pH of 8 to 10, wherein the pH of the talc or talc mixture is determined according to EN ISO 787-9:1995.

EXAMPLES

Materials Used:

PC1: a linear bisphenol A polycarbonate having an average molecular weight Mw of about 31 000 g/mol from Covestro Deutschland AG and a softening temperature (VST/B 120 to ISO 306:2014-3) of 150° C., which does not contain any UV absorber. The melt volume flow rate (MVR) to ISO 1133:2012-03 is 6.0 cm$^3$/(10 min) at 300° C. with a 1.2 kg load.

PC2: a commercially available copolycarbonate based on bisphenol A and bisphenol TMC from Covestro Deutschland AG, having an MVR of 18 cm$^3$/10 min at 330° C. and a load of 2.16 kg and a softening temperature (VST/B 120 to ISO 306:2014-3) of 183° C.

PC3: a linear bisphenol A polycarbonate having an average molecular weight Mw of about 24 000 g/mol from Covestro Deutschland AG and a softening temperature (VST/B 120 to ISO 306:2014-3) of 148° C., which does not contain any UV absorber. The melt volume flow rate (MVR) to ISO 1133:2012-03 is 19.0 cm$^3$/(10 min) at 300° C. with a 1.2 kg load.

B1 (inventive): compacted unsized talc having a talc content of 99% by weight, an iron oxide content of 0.4% by weight, an aluminium oxide content of 0.4% by weight, ignition loss of 6.0% by weight, pH (to EN ISO 787-9:1995) of 9.55, D50 (sedimentation analysis to ISO 13317-3:2001) of 0.65 µm; BET surface area: 13.5 m$^2$/g, brand: HTP Ultra5c, manufacturer: Imifabi.

B2 (inventive): compacted unsized talc having a talc content of 98% by weight, an iron oxide content of 1.9% by weight, an aluminium oxide content of 0.2% by weight, ignition loss (DIN 51081/1000° C.) of 5.4% by weight, pH (to EN ISO 787-9:1995) of 9.15, D50 (sedimentation analysis to ISO 13317-3:2001) of 2.2 µm; BET surface area to ISO 4652:2012: 10 m$^2$/g, brand: Finntalc M05SLC, manufacturer: Mondo Minerals B. V.

B3 (comparative): non-compacted unsized talc having a talc content of 98% by weight, an iron oxide content of 2.0% by weight, an aluminium oxide content of 0.2% by weight, ignition loss (DIN 51081/1000° C.) of 5.4% by weight, pH (to EN ISO 787-9:1995) of 9.1, D50 (sedimentation analysis to ISO 13317-3:2001) of 10 µm; BET surface area to ISO 4652:2012: 3.5 m$^2$/g, brand: Finntalc M30SL, manufacturer: Mondo Minerals B. V.

C1: ethylene-propylene-octene terpolymer with maleic anhydride (ethylene:propylene:octene 87:6:7 (weight ratio)), CAS No. 31069-12-2, with molecular weight (gel permeation chromatography in ortho-dichlorobenzene at 150° C. with polystyrene calibration) Mw=6301 g/mol, Mn=1159 g/mol, density 940 kg/m$^3$, acid number 53 mg KOH/g, maleic anhydride content 4.4% by weight, based on the terpolymer C1.

C2: propylene-maleic anhydride polymer having an average molecular weight (gel permeation chromatography in ortho-dichlorobenzene at 150° C. with polystyrene calibration) Mw=20 700 g/mol, Mn=1460 g/mol, acid number 78 mg KOH/g. E: titanium dioxide, sized titanium dioxide, brand: Kronos® 2230, manufacturer: Kronos Titan GmbH, Germany.

D1 (inventive): highly crystalline boron nitride powder (mix of platelets and agglomerates) having a D50 of 16 µm (laser diffraction to ISO 13320:2009); BET surface area (to ISO 4652:2012) of 8.0 m$^2$/g, brand: CF600, manufacturer: Momentive Performance Materials Inc.

D2 (comparative): highly conductive expanded graphite powder having a D50≥800 µm and a carbon content ≥98%, brand: Sigratherm® GFG 900, manufacturer: SGL CARBON GmbH.

D3 (inventive): compacted expanded graphite (powder) having a D50 of 38 µm (laser diffraction to ISO 13320:2009), a carbon content ≥99%, a BET surface area (to ISO 9277:2010) of 25.0 m$^2$/g, brand: TIMREX® C-Therm001, manufacturer: Imerys Graphite & Carbon Switzerland Ltd.

F: customary additives, such as thermal stabilizers, in the examples Irganox© B 900 from BASF Lampertheim GmbH.

The acid numbers of components C1 and C2 were determined according to DIN ISO 17025:2005 by Currenta GmbH & Co. OHG, Leverkusen, via potentiometric titration with alcoholic potassium hydroxide solution.

Melt volume flow rate (MVR) was determined in accordance with ISO 1133-1:2012 at a test temperature of 300° C., mass 1.2 kg, or 330° C. and 2.16 kg, using a Zwick 4106 instrument from Zwick Roell. The abbreviation MVR here represents the initial melt volume flow rate (after a preheating time of 4 minutes).

Charpy impact resistance was measured according to ISO 179/1eU (2010 version) on single-side-injected test bars measuring 80 mm×10 mm×4 mm at 23° C.

As a measure of thermal stability/heat distortion resistance, the Vicat softening temperature VST/B50 or VST/B120 was determined according to ISO 306 (2014 version) on 80 mm×10 mm×4 mm test specimens with a needle load of 50 N and a heating rate of 50° C./h or 120° C./h using a Coesfeld Eco 2920 instrument from Coesfeld Materialtest.

Thermal conductivity was determined on injection-moulded test specimens of dimensions 60×60×2 mm to ASTM E 1461 (2013 version, Nano Flash method).

Coefficient of linear thermal expansion (CLTE) was determined on an injection-moulded test specimen having dimensions of 10×10×4 mm to DIN 53752 (1980-12) with a Mettler Toledo TMA/SDTA 1+ instrument.

Surface quality was determined visually on injection-moulded parts having dimensions of 150×105×3 mm. The surface of the test specimens rated as poor was one that had an average on the surface of the test specimens (150×105 mm) of more than 10 defects clearly apparent to the eye (bumps, "spots" or "blisters", depressions, agglomerates).

Shear viscosities or melt viscosities were ascertained according to ISO 11443 Method A2 at a temperature of 300° C. with a VISCORobo instrument from Göttfert Werkstoff-Prüfmaschinen GmbH.

TABLE 1

| Components | V1 | 1 | 2 | 3 | V2 | 4 | 5 | 6 | V3 | 7 | V4 |
|---|---|---|---|---|---|---|---|---|---|---|---|
| PC1 | | | | | | | | | | | |
| PC2 | | | | | | | | | | | |
| PC3 | 89.50 | 79.00 | 68.50 | 58.00 | 47.50 | 74.00 | 69.00 | 79.00 | 69.00 | 66.50 | 66.50 |
| B1 | | | | | | | | | | | |
| B2 | 10.00 | 20.00 | 30.00 | 40.00 | 50.00 | 20.00 | 20.00 | 10.00 | 10.00 | 30.00 | |
| B3 | | | | | | | | | | | 30.00 |
| C1 | 0.50 | 1.00 | 1.50 | 2.00 | 2.50 | 1.00 | 1.00 | 1.00 | 1.00 | 1.50 | 1.50 |
| C2 | | | | | | | | | | | |
| D1 | | | | | | 5.00 | 10.00 | 10.00 | 20.00 | | |
| D2 | | | | | | | | | | | |
| D3 | | | | | | | | | | | |
| E | | | | | | | | | | 2.00 | 2.00 |
| F | | | | | | | | | | | |

TABLE 1-continued

| Components | | | V1 | 1 | 2 | 3 | V2 | 4 | 5 | 6 | V3 | 7 | V4 |
|---|---|---|---|---|---|---|---|---|---|---|---|---|---|
| visual assessment of a 150 × 105 × 3 mm injection moulding | | | good | good | good | good | poor | good | good | good | poor | good | poor |
| melt viscosity to ISO 11443 at 300° C. | [s⁻¹] | | | | | | | | | | | | |
| | 50 | Pas | 248 | 261 | 324 | 385 | 245 | 316 | 370 | 363 | 500 | 326 | 456 |
| | 100 | Pas | 249 | 247 | 295 | 339 | 186 | 302 | 340 | 347 | 447 | 292 | 404 |
| | 200 | Pas | 242 | 221 | 256 | 294 | 154 | 276 | 306 | 320 | 402 | 261 | 350 |
| | 500 | Pas | 211 | 183 | 186 | 225 | 120 | 227 | 246 | 267 | 315 | 210 | 270 |
| | 1000 | Pas | 177 | 157 | 149 | 172 | 98 | 183 | 195 | 216 | 248 | 168 | 209 |
| | 1500 | Pas | 159 | 141 | 133 | 146 | 85 | 158 | 168 | 185 | 209 | 146 | 176 |
| | 5000 | Pas | 96 | 90 | 84 | 80 | 54 | 89 | 93 | 101 | 112 | 83 | 98 |
| Charpy impact resistance to ISO179/1eU | 23° C. | kJ/m² | 249 | 171 | 84 | 20 | 8 | 43 | 33 | 54 | 27 | 78 | 35 |
| VICAT B to ISO 306 at 50 K/h | 50 K/h | ° C. | 143.9 | 143.4 | 144.0 | 143.3 | 142.9 | 145.4 | 146.0 | 146.2 | 146.7 | 144.4 | 144.2 |
| Thermal conductivity to ASTM E 1461 at 23° C. | in-plane | W/mK | 0.34 | 0.56 | 0.97 | 1.37 | 1.83 | 0.84 | 1.20 | 0.82 | 1.65 | 0.91 | 0.94 |
| | through-plane | W/mK | 0.22 | 0.23 | 0.25 | 0.28 | 0.32 | 0.30 | 0.30 | 0.28 | 0.38 | 0.23 | 0.25 |
| Coefficient of linear thermal expansion (CLTE) to DIN 53752 | parallel | ppm/K | 51.7 | 42.0 | 36.9 | 30.8 | 34.8 | 39.4 | 36.6 | 42.8 | 34.1 | 35.2 | 37.5 |
| | transverse | ppm/K | 59.2 | 55.5 | 52.1 | 52.2 | 43.4 | 53.8 | 52.9 | 56.3 | 49.4 | 54.0 | 54.0 |

TABLE 2

| Components | | | 8 | 9 | V5 | 10 | V6 | 11 | 12 | V7 | V8 | V9 | V10 |
|---|---|---|---|---|---|---|---|---|---|---|---|---|---|
| PC1 | | | | | | | | | 71.8 | 8.8 | | | |
| PC2 | | | | | | | | | | 63.0 | | | |
| PC3 | | | 78.8 | 73.8 | 73.8 | 71.8 | 71.8 | | | 68.8 | 68.8 | 88.8 | 88.8 |
| B1 | | | 20.0 | 20.0 | 20.0 | 20.0 | 20.0 | 20.0 | 20.0 | 20.0 | 20.0 | | |
| B2 | | | | | | | | | | | | | |
| B3 | | | | | | | | | | | | | |
| C1 | | | | | | | | | | | | | |
| C2 | | | 1.0 | 1.0 | 1.0 | 1.0 | 1.0 | 1.0 | 1.0 | 1.0 | 1.0 | 1.0 | 1.0 |
| D1 | | | | | | | | | | | | | |
| D2 | | | | | 5.0 | | 7.0 | | | 10.0 | | 10.0 | |
| D3 | | | | 5.0 | | 7.0 | | 7.0 | 7.0 | | 10.0 | | 10.0 |
| E | | | | | | | | | | | | | |
| F | | | 0.2 | 0.2 | 0.2 | 0.2 | 0.2 | 0.2 | 0.2 | 0.2 | 0.2 | 0.2 | 0.2 |
| visual assessment of a 150 × 105 × 3 mm injection moulding | | | good | good | poor | good | poor | good | good | poor | poor | poor | poor |
| melt viscosity to ISO 11443 at 300° C. | [s⁻¹] | | | | | | | | | | | | |
| | 50 | Pas | 244 | 442 | 460 | 571 | 533 | 1165 | 1179 | 625 | 707 | 496 | 668 |
| | 100 | Pas | 228 | 369 | 397 | 469 | 442 | 884 | 983 | 476 | 549 | 429 | 602 |
| | 200 | Pas | 218 | 305 | 332 | 378 | 363 | 691 | 772 | 380 | 424 | 362 | 507 |
| | 500 | Pas | 185 | 230 | 256 | 279 | 273 | 494 | 563 | 277 | 309 | 285 | 368 |
| | 1000 | Pas | 154 | 182 | 203 | 216 | 213 | 373 | 418 | 215 | 237 | 222 | 273 |
| | 1500 | Pas | 138 | 157 | 175 | 183 | 182 | 309 | 349 | 183 | 200 | 186 | 229 |
| | 5000 | Pas | 82 | 89 | 98 | 100 | 100 | 149 | 169 | 100 | 108 | 107 | 123 |
| Charpy impact resistance to ISO179/1eU | 23° C. | kJ/m² | 138 | 24 | 20 | 22 | 18 | 16 | 13 | 13 | 14 | 25 | 33 |
| VICAT B to ISO 306 at 50 K/h | 50 K/h | ° C. | 144.0 | 145.1 | 145.0 | 145.9 | 145.0 | 143.5 | 172.1 | 145.2 | 146.2 | 144.5 | 146.0 |
| Thermal conductivity to ASTM E 1461 at 23° C. | in-plane | W/mK | 0.61 | 1.52 | 1.53 | 1.93 | 2.03 | 2.64 | 2.16 | 3.52 | 3.39 | 1.47 | 1.21 |
| | through-plane | W/mK | 0.22 | 0.33 | 0.33 | 0.34 | 0.35 | 0.35 | 0.31 | 0.46 | 0.45 | 0.39 | 0.40 |
| Coefficient of linear thermal expansion (CLTE) to DIN 53752 | parallel | ppm/K | 43.6 | 39.0 | 43.3 | 38.4 | 40.1 | 34.8 | 34.5 | 35.4 | 30.3 | 56.2 | 53.0 |
| | transverse | ppm/K | 59.6 | 54.2 | 54.8 | 53.7 | 53.8 | 51.5 | 50.5 | 50.0 | 51.3 | 61.5 | 62.1 |

V = comparison

It is apparent from the examples of Tables 1 and 2 that the inventive examples, with comparable or better heat distortion resistance, have improved dimensional stability (CLTE), good impact resistance and better surface quality than the comparative examples (Examples 1, 2 and 3 versus V1 and V2). Moreover, a distinct improvement in thermal conductivity was surprisingly found for Examples 1, 2 and 3 over V1. If too low a content of component B is chosen, dimensional stability is inadequate (V1); too high a content of component B has an adverse effect on surface quality and impact resistance (V2). If some of component B is replaced by optional component D1 (boron nitride), heat distortion resistance, dimensional stability (CLTE), impact resistance and surface quality can be optimized, but the amount of D1 chosen must not be too high since surface quality is otherwise adversely affected (Examples 4, 5 and 6 versus V3). The improved properties of Example 2 can even be retained when a pigment E is additionally added (Example 7), but important properties such as surface quality and impact resistance are lost when the non-inventive component B3 is used in place of B2 (7 versus V4).

If a portion of component B is replaced by optional component D2 or D3 (expanded graphite), dimensional stability (CLTE) and thermal conductivity can be improved even further (examples 8 and 9), but a good surface quality results only when the inventive graphite D3 is used. When the non-inventive graphite D2 is used, surface quality is poor irrespective of the concentration of D2. Moreover, the inventive graphite D3 shows advantages in impact resistance and dimensional stability over D2 (Example 9 versus V5, 10 versus V6).

As shown by Examples 11 and 12, the improvement in the dimensional stability of Example 10 can be brought about with simultaneously high or improved heat distortion resistance in other polycarbonates (PC1) and copolycarbonates (PC2) as well. Here, in particular, the use of PC1 in Example 11 shows a surprisingly significant improvement in thermal conductivity that would not have been expected by the person skilled in the art.

As shown by Comparative Examples V7, V8, V9 and V10, the concentration of inventive component D3 chosen must not be too high since the result is otherwise a poor surface quality as is generally the case when the non-inventive component D2 is used.

All inventive examples, in spite of the high filler content, have good impact resistance to ISO179/1eU and good processability in injection moulding processes, which is apparent from the melt viscosity profiles.

The invention claimed is:

1. A multilayer body comprising
  I) a substrate layer (S),
  II) a metal layer (M) bonded directly to the substrate layer and
  III) optionally a protective layer (P) atop the metal layer,
    wherein the substrate layer comprises a composition obtained by mixing components A)-C) and optionally component D), wherein
  A) is a polycarbonate,
  B) is an unsized talc having a median particle diameter D50 of 0.01 to 9.5 µm, where the particle diameter D50 is determined by sedimentation analysis,
  C) is at least one anhydride-modified alpha-olefin polymer having an acid number of at least 30 mg KOH/g, determined by means of potentiometric titration with alcoholic potassium hydroxide solution according to DIN ISO 17025:2005, and an average molecular weight MW of 4000 to 40 000 g/mol, where the average molecular weight MW is determined by means of gel permeation chromatography in ortho-dichlorobenzene at 150° C. with polystyrene calibration,
  and optionally
  D) a portion of the amount of component B) may be replaced by at least one filler different from the unsized talc selected from the group consisting of an expanded graphite having a particle diameter D50 of less than 800 µm or a mixture of the aforementioned expanded graphite with unexpanded graphite and a boron nitride, where, in the case of graphite, up to 8 parts by weight of the amount of component B) may be replaced and where, in the case of boron nitride, up to 15 parts by weight of the amount of component B) may be replaced,
  wherein the amounts of components B) and C) prior to mixing with component C) are matched to one another such that, for every 10 parts by weight of component B), 0.10 to 1.4 parts by weight of component C) are used, and wherein the composition is free of graft polymers and polyesters.

2. The multilayer body according to claim 1, wherein the amount of B) is 12% to 45% by weight, based on the overall composition.

3. The multilayer body according to claim 1, wherein the amount of B) is 18% to 35% by weight, based on the overall composition.

4. The multilayer body according to claim 1, wherein the amounts of B) and C) prior to mixing are matched to one another such that, for every 10 parts by weight of component B), 0.25 to 1.4 parts by weight of component C) are used.

5. The multilayer body according to claim 1, wherein the talc or talc mixture of component B) has a pH of 8 to 10, wherein the pH of the talc or talc mixture is determined according to EN ISO 787-9:1995.

6. The multilayer body according to claim 1, wherein component B) has a median particle diameter D50 of 0.5 to 3.0 µm, wherein the particle diameter D50 is determined by sedimentation analysis.

7. The multilayer body according to claim 1, wherein component B) has a BET surface area of 7.5 to 20.0 m$^2$/g.

8. The multilayer body according to claim 1, wherein the substrate layer has a thickness of 0.1 mm to 6.0 mm, the metal layer a thickness of 10 nm to 1000 nm, and the optional protective layer a thickness of 5 nm to 200 nm.

9. The multilayer body according to claim 1, wherein the metal layer comprises at least one metal which is selected from the group consisting of aluminium, silver, chromium, titanium and palladium.

10. The multilayer body according to claim 1, wherein the metal layer comprises silver or aluminium.

11. The multilayer body according to claim 1, wherein, if graphite is present as component D), 2 to 7 parts by weight of the amount of component B) are replaced, and wherein, if boron nitride is present as component D), 2 to 12 parts by weight of the amount of component B) are replaced.

12. An article comprising the multilayer body according to claim 1, wherein the article is selected from the group consisting of reflectors, components of light sources, and components of heat sources.

13. A process for producing the multilayer body according to claim 1, comprising the steps of
  a) forming the substrate layer by injection moulding or extrusion of the composition, at least comprising components A) to C), optionally comprising component D),
  b) applying the metal layer to the layer obtained in step (a) in a plasma process and c) optionally applying at least one further layer, and d) optionally applying the protective layer to the layer obtained in step (b) or (c).

14. A method comprising providing at least one anhydride-modified alpha-olefin polymer C) having an acid number of at least 30 mg KOH/g and an average molecular weight Mw of 4000 to 25 000 g/mol, wherein the average molecular weight $M_W$ is determined by means of gel permeation chromatography in ortho-dichlorobenzene at 150° C. with polystyrene calibration, for production of a substrate layer of a multilayer body, wherein the multilayer body comprises at least the one substrate layer, a metal layer bonded directly to the substrate layer and optionally at least one layer atop the metal layer, and wherein the substrate layer comprises a composition which is obtained by mixing at least components A)-C) and optionally component D), wherein A) is a polycarbonate and B) is an unsized talc, and optionally D) a portion of the amount of component B) may be replaced by at least one filler different from the unsized talc selected from the group consisting of an expanded graphite having a particle diameter D50 of less than 800 μm or a mixture of the aforementioned expanded graphite with unexpanded graphite and a boron nitride.

15. The method according to claim 14, wherein the amounts of B) and C) prior to mixing are matched to one another such that, for every 10 parts by weight of component B), 0.25 to 1.4 parts by weight of component C) are used.

* * * * *